(12) United States Patent
He et al.

(10) Patent No.: US 12,538,506 B2
(45) Date of Patent: Jan. 27, 2026

(54) TUNNELING FIELD EFFECT TRANSISTOR AND MANUFACTURING METHOD THEREOF, DISPLAY PANEL AND DISPLAY APPARATUS

(71) Applicant: BOE Technology Group Co., Ltd., Beijing (CN)

(72) Inventors: Jiayu He, Beijing (CN); Yan Qu, Beijing (CN); Ce Ning, Beijing (CN); Hehe Hu, Beijing (CN); Zhengliang Li, Beijing (CN); Nianqi Yao, Beijing (CN); Jie Huang, Beijing (CN); Kun Zhao, Beijing (CN); Feifei Li, Beijing (CN); Liping Lei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 390 days.

(21) Appl. No.: 18/026,833

(22) PCT Filed: May 27, 2022

(86) PCT No.: PCT/CN2022/095764
§ 371 (c)(1),
(2) Date: Mar. 17, 2023

(87) PCT Pub. No.: WO2023/226043
PCT Pub. Date: Nov. 30, 2023

(65) Prior Publication Data
US 2024/0297243 A1    Sep. 5, 2024

(51) Int. Cl.
*H10D 10/00* (2025.01)
*H10D 12/00* (2025.01)
(Continued)

(52) U.S. Cl.
CPC ......... *H10D 10/231* (2025.01); *H10D 12/021* (2025.01); *H10D 12/211* (2025.01);
(Continued)

(58) Field of Classification Search
CPC .... H10D 10/021; H10D 10/231; H10D 10/80; H10D 48/031; H10D 12/021;
(Continued)

(56) References Cited

U.S. PATENT DOCUMENTS 10,249,744 B2    4/2019  Zhao et al.
2012/0032227 A1  2/2012  Seabaugh et al.
(Continued)

FOREIGN PATENT DOCUMENTS

CN    103606563 A    2/2014
CN    103715259 A    4/2014
(Continued)

*Primary Examiner* — Cheung Lee
(74) *Attorney, Agent, or Firm* — Ling Wu; Stephen Yang; Ling and Yang Intellectual Property

(57) ABSTRACT

A tunneling field effect transistor includes a gate electrode, a tunneling field active layer, a first electrode, and a second electrode disposed on a base substrate; the tunneling field active layer includes a first-type active layer and a second-type active layer that are stacked, wherein the first-type active layer includes a first-type channel region and a first source-drain region, the second-type active layer includes a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode.

19 Claims, 8 Drawing Sheets

(51) Int. Cl.
*H10D 12/01* (2025.01)
*H10D 62/13* (2025.01)
*H10D 62/17* (2025.01)
*H10D 62/822* (2025.01)
*H10D 84/85* (2025.01)

(52) U.S. Cl.
CPC ......... *H10D 62/151* (2025.01); *H10D 62/213* (2025.01); *H10D 62/822* (2025.01); *H10D 84/85* (2025.01)

(58) Field of Classification Search
CPC ................. H10D 12/211; H10D 18/40; H10D 18/60–655; H10D 62/151; H10D 62/159; H10D 62/213; H10D 62/822; H10D 62/83; H10D 84/8311; H10D 84/8312; H10D 84/83135; H10D 84/83138; H10D 84/8314; H10D 84/8316; H10D 84/85; H10D 84/851–852
See application file for complete search history.

(56) References Cited

U.S. PATENT DOCUMENTS

| | | |
|---|---|---|
| 2014/0097403 A1 | 4/2014 | Heo et al. |
| 2016/0268256 A1 | 9/2016 | Yang et al. |
| 2016/0322460 A1 | 11/2016 | Chung et al. |
| 2021/0005758 A1 | 1/2021 | Kato et al. |
| 2021/0210639 A1 | 7/2021 | Liu et al. |

FOREIGN PATENT DOCUMENTS

| | | |
|---|---|---|
| CN | 106098768 A | 11/2016 |
| CN | 107431068 A | 12/2017 |
| CN | 109920802 A | 6/2019 |
| CN | 108140672 B | 8/2020 |
| CN | 112292762 A | 1/2021 |
| CN | 112424917 A | 2/2021 |
| KR | 10-2019-0005080 A | 1/2019 |

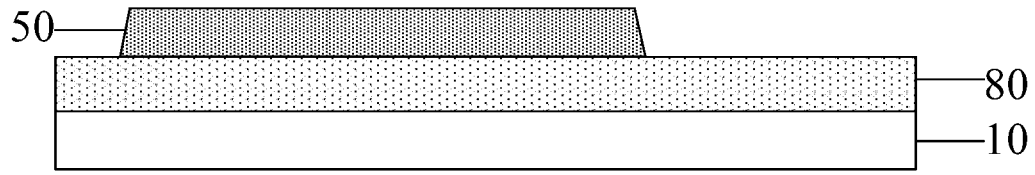
FIG. 7
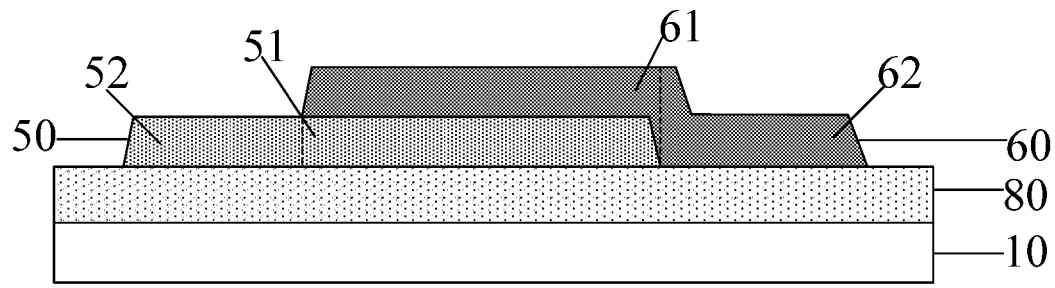
FIG. 8A
FIG. 8B
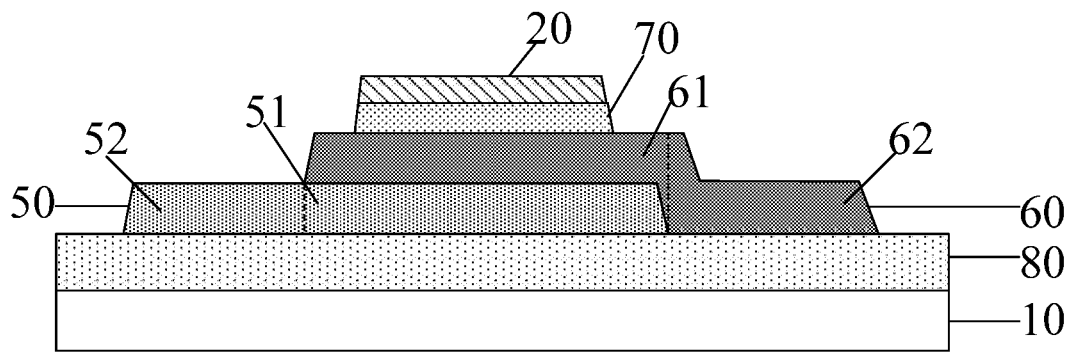
FIG. 8C

TUNNELING FIELD EFFECT TRANSISTOR AND MANUFACTURING METHOD THEREOF, DISPLAY PANEL AND DISPLAY APPARATUS

CROSS-REFERENCE TO RELATED APPLICATION

This application is a national stage application of PCT Application No. PCT/CN2022/095764, which is filed on May 27, 2022 and entitled "Tunneling Field Effect Transistor and Manufacturing Method Thereof, Display Panel and Display Apparatus", the content of which should be regarded as being incorporated herein by reference.

TECHNICAL FIELD

Embodiments of the present disclosure relate to, but are not limited to, the field of display technology, in particular to a tunneling field effect transistor and a manufacturing method thereof, a display panel, and a display apparatus.

BACKGROUND

Since a characteristic of a Subthreshold swing (ss) of a steep slope has a great influence on a characteristic of a Thin Film Transistor (TFT), in order to improve the ss of the TFT, a Tunneling Field Effect Transistor (TFET) has been widely studied. A working principle of the TFET is inter-band tunneling, its ss can break through a limit of 60 mV/decade, and an Ioff of the TFET is very low, so the TFET can achieve reducing of a power supply voltage (Vdd) of a Field Effect Transistor (FET) without increasing the Ioff or decreasing ions. A drive current (Ion) and a switching ratio (Ion/Ioff) of the TFET will both be larger than an Ion and a Ion/Ioff of a traditional Metal Oxide Semiconductor Field Effect Transistor (MOSFET) at a relatively small gate voltage. Therefore, the TFET is regarded as a very promising logic Complementary Metal Oxide Semiconductor (CMOS) device with a low operating voltage and a low power consumption.

SUMMARY

The following is a summary of subject matters described herein in detail. This summary is not intended to limit the protection scope of the present application.

An embodiment of the present disclosure provides a tunneling field effect transistor, including a gate electrode, a tunneling field active layer, a first electrode, and a second electrode disposed on a base substrate; the tunneling field active layer includes a first-type active layer and a second-type active layer that are stacked, the first-type active layer includes a first-type channel region and a first source-drain region, the second-type active layer includes a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode, the second source-drain region is located at another side of the tunneling field active layer and is connected with the second electrode, and an orthographic projection of the gate electrode on the base substrate is located within a range of an orthographic projection of the first-type channel region and the second-type channel region on the base substrate.

An embodiment of the present disclosure also provides a manufacturing method for a tunneling field effect transistor, including: forming a gate electrode, a tunneling field active layer, a first electrode, and a second electrode on a base substrate; wherein the tunneling field active layer includes a first-type active layer and a second-type active layer that are stacked, wherein the first-type active layer includes a first-type channel region and a first source-drain region, the second-type active layer includes a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode, the second source-drain region is located at another side of the tunneling field active layer and is connected with the second electrode, and an orthographic projection of the gate electrode on the base substrate is located within a range of an orthographic projection of the first-type channel region and the second-type channel region on the base substrate.

An embodiment of the present disclosure also provides a display panel, including the tunneling field effect transistor as provided in the above embodiment of the present disclosure.

An embodiment of the present disclosure also provides a display apparatus, wherein the display apparatus includes the display panel as provided in the above embodiment of the present disclosure.

Other aspects may be understood upon reading and understanding the drawings and the detailed description.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

FIG. 7 is a process flow chart of a method for manufacturing a tunneling field effect transistor according to an exemplary embodiment of the present disclosure.

FIGS. 8A to 8C are process flow charts of a method for manufacturing another tunneling field effect transistor according to an exemplary embodiment of the present disclosure.

Figure 1:
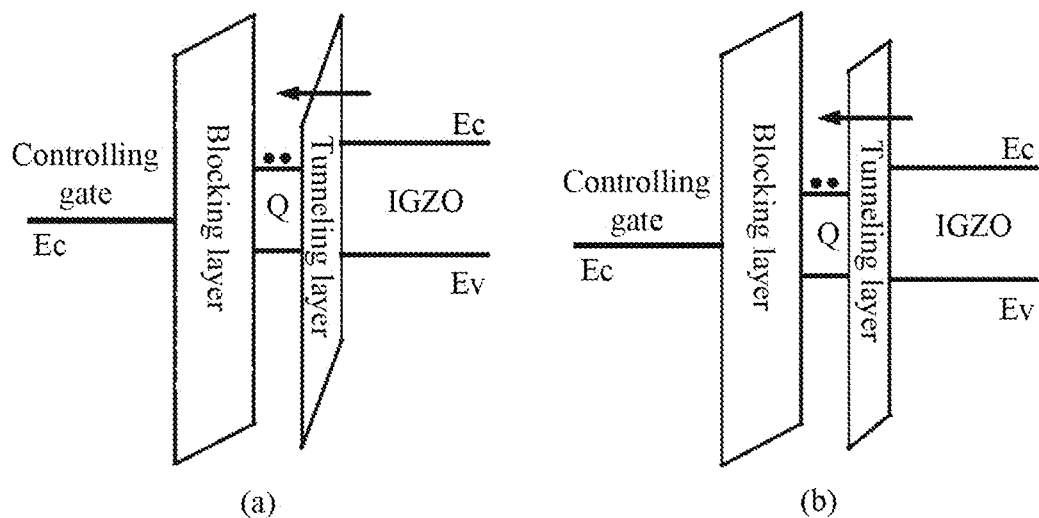
FIG. 1 is an energy band structure diagram of FN tunneling and DT tunneling, wherein (a) is an energy band structure diagram of the FN tunneling; and (b) is an energy band structure diagram of the DT tunneling.

Meanings of reference signs in the accompanying drawings are as follows.

T1—first tunneling field effect transistor; T2—second tunneling field effect transistor;
10—base substrate;
20—gate electrode; 21—first gate electrode; 22—second gate electrode;
30—source electrode; 31—first source electrode; 32—second source electrode;
40—drain electrode; 41—first drain electrode; 42—second drain electrode;
50—first-type active layer; 501—first first-type active layer; 502—second first-type active layer;
51—first-type channel region; 511—first first-type channel region; 512—second first-type channel region;
52—first source region; 53—second source region;
60—second-type active layer; 601—first second-type active layer; 602—second second-type active layer;
61—second-type channel region; 611—first second-type channel region; 612—second second-type channel region;
62—first drain region; 63—second drain region;
70—gate insulating layer; 71—first gate insulating layer; 72—second gate insulating layer;
80—buffer layer; 81—first buffer layer; 82—second buffer layer.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

In the description of the present disclosure, ordinal numerals such as "first", "second", and the like are set to avoid a confusion of constituent elements, but not intended for restriction in quantity.

In the specification, for convenience, wordings indicating orientation or positional relationships, such as "middle", "upper", "lower", "front", "back", "vertical", "horizontal", "top", "bottom", "inside", "outside", and the like, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "set" and "connect" should be understood in a broad sense. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, a "film" and a "layer" are interchangeable. For example, a "buffer layer" may be replaced with a "buffer film" sometimes.

An essence of channel electron thermal injection is an avalanche breakdown of electrons. A source voltage $V_S=0$, a drain voltage $V_D>0$, and a gate is connected with a positive high voltage. When a gate-source voltage $V_{GS}$ is greater than an opening voltage of a TFT and a source-drain voltage $V_{SD}$ is greater than a breakdown voltage, a very large electric field will be generated between a source and a drain. Under an action of this electric field, the electrons will accelerate directionally and obtain a huge speed. At this time, the electrons moving at a high speed will impact a fixed charge in a channel, making electrons in the channel leave an atomic surface and move in an electric field formed by a gate-drain voltage.

Current tunneling mechanisms include FN tunneling and DT tunneling, wherein the FN tunneling is an ideal tunneling mode. FIG. 1 is an energy band structure diagram of FN tunneling and DT tunneling, wherein, (a) is an energy band structure diagram of the FN tunneling; (b) is an energy band structure diagram of the DT tunneling; Ec is a conduction band, and Ev is a valence band. A current density of the FN tunneling is correlated with a gate voltage, a barrier height, and a thickness of an oxide layer. When the gate voltage is relatively large and a thickness of a tunneling layer is relatively thin, the greater a field strength existing in the tunneling layer, the higher an energy obtained by electrons, the greater a tunneling probability, and the greater a tunneling current density. Formulas involved are as follows.

$$E_{ox} = \frac{V_{FG} - V_{FB} - \Phi_s}{T_{ox}} \quad (1)$$

$$J_n = C \cdot \frac{q^3}{8phF_b e_{ox}} \exp\left(\frac{-8p\sqrt{2m_{ox}} F_b^{3/2}\left[1-\left(1-\frac{|V_{ox}|}{F_b}\right)^{3/2}\right]}{3hq|E_{ox}|}\right) \quad (2)$$

Wherein C is a coefficient related to $V_g$, $V_{ox}$, $t_{ox}$, and $\varphi_b$, and its expression is:

$$C = \exp\left[\frac{20}{\Phi_b}\left(\frac{|V_{ox}|-\Phi_b}{\Phi_{b0}}+1\right)^\alpha \left(1-\frac{|V_{ox}|}{\Phi_b}\right)\right]\left(\frac{V_g}{t_{ox}}\right) \cdot N \quad (3)$$

α is a tunneling coefficient determined by a tunneling process, $\varphi_{b0}$ is an energy band deviation between an underlay substrate and a dielectric layer, $\varphi_b$ is an actual tunneling barrier height, and N is a correction coefficient.

When the thickness of the tunneling layer is small enough to be close to a size of De Broglie wave, electrons can directly tunnel from the dielectric layer into a charge storage layer, and this tunneling mode is the DT tunneling.

Obviously, the FN tunneling and the DT tunneling are both closely related to an external electric field, and a size of the external electric field almost determines a size of a tunneling current. When the thickness of the tunneling layer is relatively large, the DT tunneling is limited, and the FN tunneling is more likely to occur; when the tunneling layer is relatively thin, the DT tunneling is relatively easy to occur.

An embodiment of the present disclosure provides a tunneling field effect transistor, including a gate electrode, a tunneling field active layer, a first electrode, and a second electrode disposed on a base substrate; the tunneling field active layer includes a first-type active layer and a second-type active layer that are stacked, wherein the first-type active layer includes a first-type channel region and a first source-drain region, the second-type active layer includes a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode, the second source-drain region is located at another side of the tunneling field active layer and is connected with the second electrode, and an orthographic projection of the gate electrode on the base substrate is located within a range of an orthographic projection of the first-type channel region and the second-type channel region on the base substrate.

The tunneling field effect transistor of the embodiment of the present disclosure adopts a double-layer tunneling field active layer (including the first-type active layer and the second-type active layer) to form a double-layer tunneling channel. On one hand, from a perspective of geometric structure, a p+-i-n+ or p-n junction of the tunneling field effect transistor including the double-layer tunneling field active layer is perpendicular to the gate electrode, a junction area is large, a tunneling channel distance is short, and the gate electrode has a strong controllability in a whole tunnel junction region, so an Ion of the tunneling field effect transistor is very high, an SS is extremely small, and it is beneficial to reduce a size of the tunneling field effect transistor and improve a resolution; on the other hand, the double-layer tunneling field active layer can increase the thickness of the tunneling layer, so that the DT tunneling is limited, and ideal FN tunneling is more likely to occur.

Compared with Low Temperature Polycrystalline Oxide (LTPO) technology, the tunneling field effect transistor provided by the embodiment of the present disclosure has the following advantages: (1) organic materials can be avoided, and an influence of water and H in the organic materials on TFET characteristics can be avoided; (2) manufacturing of a CMOS TFET can be achieved and a static power consumption can be reduced. In addition, after a vertical-type TFET is fabricated, TFET areas in a GOA region and an AA region can be reduced, improving an aperture ratio of devices.

In an exemplary embodiment of the present disclosure, the first source-drain region may be a source region and the second source-drain region may be a drain region; or, the first source-drain region may be a drain region and the second source-drain region may be a source region.

In an exemplary embodiment of the present disclosure, the tunneling field effect transistor may be in a top gate structure or a bottom gate structure.

In an exemplary embodiment of the present disclosure, the tunneling field effect transistor may be in a top gate structure, and the tunneling field active layer is disposed between the base substrate and the gate electrode.

Figure 2:
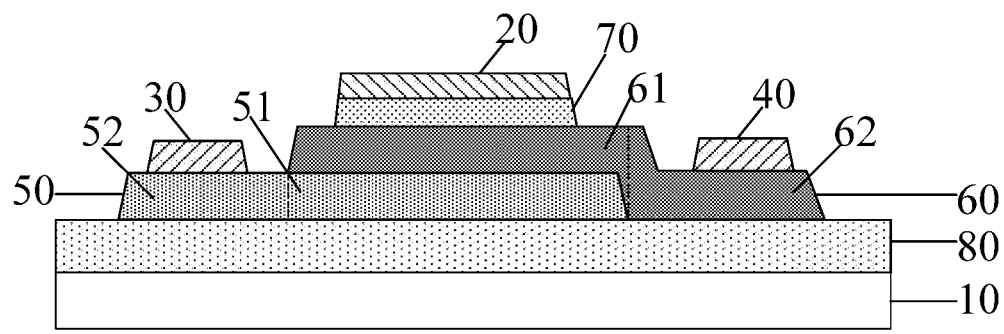
FIG. 2 is a schematic diagram of a structure of a tunneling field effect transistor according to an exemplary embodiment of the present disclosure.

FIG. 2 is a schematic diagram of a structure of a tunneling field effect transistor according to an exemplary embodiment of the present disclosure. As shown in FIG. 2, the tunneling field effect transistor may be a top gate structure, and the tunneling field effect transistor may at least include: a gate electrode 20, a tunneling field active layer, a source electrode 30, and a drain electrode 40; wherein the tunneling field active layer includes a first-type active layer 50 and a second-type active layer 60 that are stacked, wherein the first-type active layer 50 is disposed at a side of a base substrate 10, the first-type active layer 50 includes a first-type channel region 51 and a first source region 52, the second-type active layer 60 includes a second-type channel region 61 and a first drain region 62, an orthographic projection of the first-type channel region 51 on the base substrate 10 is completely overlapped with an orthographic projection of the second-type channel region 61 on the base substrate 10, the first source region 52 is located at a side of the tunneling field active layer and is connected with the source electrode 30, the first drain region 62 is located at another side of the tunneling field active layer and is connected with the drain electrode 40, the gate electrode 20 is disposed at a side of the second-type channel region 61 away from the base substrate 10, and an orthographic projection of the gate electrode 20 on the base substrate 10 is located within a range of an orthographic projection of the first-type channel region 51 and the second-type channel region 61 on the base substrate 10.

In an exemplary embodiment of the present disclosure, the tunneling field effect transistor may be in a bottom gate structure with the gate electrode disposed between the base substrate and the tunneling field active layer.

Figure 3:
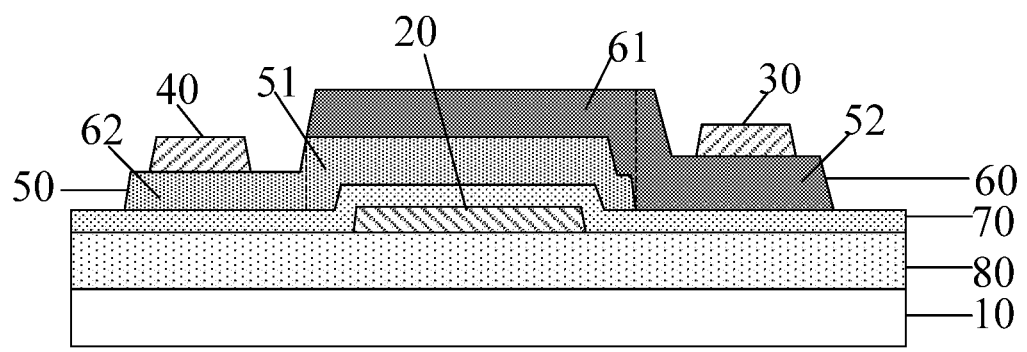
FIG. 3 is a schematic diagram of a structure of another tunneling field effect transistor according to an exemplary embodiment of the present disclosure.

FIG. 3 is a schematic diagram of a structure of another tunneling field effect transistor according to an exemplary embodiment of the present disclosure. As shown in FIG. 3, the tunneling field effect transistor may be in a bottom gate structure, and the tunneling field effect transistor may at least include: a gate electrode 20, a tunneling field active layer, a source electrode 30, and a drain electrode 40; wherein, the gate electrode 20 is disposed at a side of the base substrate 10, the tunneling field active layer includes a first-type active layer 50 and a second-type active layer 60 that are stacked, the first-type active layer 50 includes a first-type channel region 51 and a first drain region 62, the first-type active layer 50 covers the gate electrode 20 and the first-type channel region 51 is disposed at a side of the gate electrode 20 away from the base substrate 10, the second-type active layer 60 includes a second-type channel region 61 and a first source region 52, an orthographic projection of the first-type channel region 51 on the base substrate 10 is completely overlapped with an orthographic projection of the second-type channel region 61 on the base substrate 10, the first source region 52 is located at a side of the tunneling field active layer and is connected with the source electrode 30, the first drain region 62 is located at another side of the tunneling field active layer and is connected with the drain electrode 40, and an orthographic projection of the gate electrode 20 on the base substrate 10 is located within a range of an orthographic projection of the first-type channel region 51 and the second-type channel region 61 on the base substrate 10.

In an exemplary embodiment of the present disclosure, the tunneling field effect transistor may further include a gate insulating layer and a buffer layer; wherein, the buffer layer may be disposed at a side of the base substrate, the tunneling field active layer is disposed at a side of the buffer layer away from the base substrate, the gate insulating layer is disposed at a side of the tunneling field active layer away from the base substrate, the gate electrode is disposed at a side of the gate insulating layer away from the base substrate, the first source-drain region may be a source region, the first electrode may be a source electrode, the second source-drain region may be a drain region, and the second electrode may be a drain electrode; or, the buffer layer may be disposed at a side of the base substrate, the gate electrode is disposed at a side of the buffer layer away from the base substrate, the gate insulating layer is disposed at a side of the buffer layer away from the base substrate and covers the gate electrode, the tunneling field active layer is disposed at a side of the gate insulating layer away from the base substrate, the first source-drain region may be a drain region, the first electrode may be a drain electrode, the second source-drain region may be a source region, and the second electrode may be a source electrode.

As shown in FIG. 2, for the tunneling field effect transistor with a top gate structure, a buffer layer 80 may be disposed at a side of the base substrate 10, the first-type active layer 50 of the tunneling field active layer may be disposed at a side of the buffer layer 80 away from the base substrate 10, a gate insulating layer 70 is disposed at a side of the second-type active layer 60 of the tunneling field active layer away from the base substrate 10, the gate electrode 20 is disposed at a side of the gate insulating layer 70 away from the base substrate 10, the source electrode 30 is disposed at a side of the first source region 52 away from the base substrate 10, and the drain electrode 40 is disposed at a side of the first drain region 62 away from the base substrate 10.

As shown in FIG. 3, for the tunneling field effect transistor with a bottom gate structure, a buffer layer 80 may be disposed at a side of the base substrate 10, the gate electrode 20 may be disposed at a side of the buffer layer 80 away from the base substrate 10, a gate insulating layer 70 is disposed at a side of the buffer layer 80 away from the base substrate 10 and covers the gate electrode 20, the first-type active layer 50 of the tunneling field active layer is disposed at a side of the gate insulating layer 70 away from the base substrate 10, the source electrode 30 may be disposed at a side of the first source region 52 away from the base substrate 10, and the drain electrode 40 may be disposed at a side of the first drain region 62 away from the base substrate 10.

In an exemplary embodiment of the present disclosure, the tunneling field effect transistor may include a first tunneling field effect transistor and a second tunneling field effect transistor, wherein the first tunneling field effect transistor may include a first gate electrode, a first tunneling field active layer, a first source electrode, and a first drain electrode disposed on the base substrate, and the second tunneling field effect transistor may include a second gate electrode, a second tunneling field active layer, a second source electrode, and a second drain electrode disposed on the base substrate. At this time, the tunneling field effect transistor may be regarded to be in a planar-type dual TFET structure.

In an exemplary embodiment of the present disclosure, the first tunneling field active layer may include a first first-type active layer and a first second-type active layer that are stacked, wherein the first first-type active layer includes a first first-type channel region and a first source-drain region, the first second-type active layer includes a first second-type channel region and a second source-drain region, one of the first source-drain region and the second source-drain region is a first source region and the other is a first drain region; an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode; the second tunneling field active layer may include a second first-type active layer and a second second-type active layer that are stacked, wherein the second first-type active layer includes a second first-type channel region and a third source-drain region, the second second-type active layer includes a second second-type channel region and a fourth source-drain region, one of the third source-drain region and the fourth source-drain region is a second source region and the other is a second drain region;

an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

Figure 4:
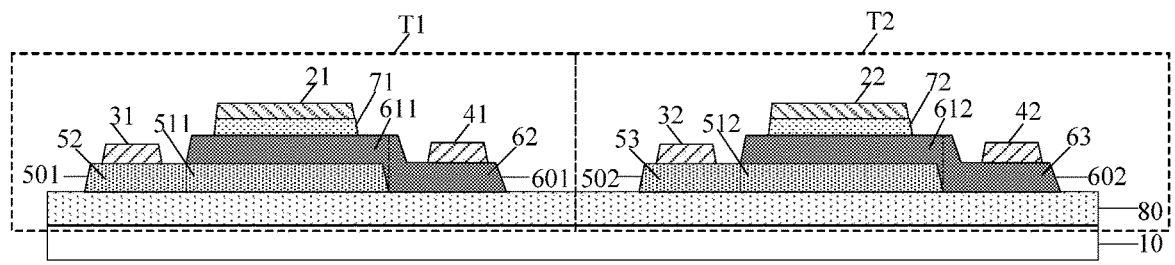
FIG. 4 is a schematic diagram of a structure of yet another tunneling field effect transistor according to an exemplary embodiment of the present disclosure.

FIG. 4 is a schematic diagram of a structure of yet another tunneling field effect transistor according to an exemplary embodiment of the present disclosure. As shown in FIG. 4, the tunneling field effect transistor may be a planar-type dual TFET structure, and may include a first tunneling field effect transistor T1 and a second tunneling field effect transistor T2, wherein the first tunneling field effect transistor T1 may include a first gate electrode 21, a first tunneling field active layer, a first source electrode 31, and a first drain electrode 41, and the second tunneling field effect transistor T2 may include a second gate electrode 22, a second tunneling field active layer, a second source electrode 32, and a second drain electrode 42; and the first tunneling field effect transistor T1 and the second tunneling field effect transistor T2 may both be in a top gate structure.

As shown in FIG. 4, the tunneling field effect transistor may include: a buffer layer 80 disposed at a side of the base substrate 10 and a semiconductor layer disposed at a side of the buffer layer 80 away from the base substrate 10, the semiconductor layer at least including a first tunneling field active layer and a second tunneling field active layer; wherein, the first tunneling field active layer includes a first first-type active layer 501 and a first second-type active layer 601 that are stacked, the first first-type active layer 501 being disposed at a side of the buffer layer 80 away from the base substrate 10, and the first second-type active layer 601 being disposed at a side of the buffer layer 80 and the first first-type active layer 501 away from the base substrate 10; the first first-type active layer 501 includes a first first-type channel region 511 and a first source region 52, and the first second-type active layer 601 includes a first second-type channel region 611 and a first drain region 62, an orthographic projection of the first first-type channel region 511 on the base substrate 10 being completely overlapped with an orthographic projection of the first second-type channel region 611 on the base substrate 10, the first source region 52 being located at a side of the first tunneling field active layer, and the first drain region 62 being located at another side of the first tunneling field active layer; the second tunneling field active layer includes a second first-type active layer 502 and a second second-type active layer 602 that are stacked, the second first-type active layer 502 being disposed at a side of the buffer layer 80 away from the base substrate 10, and the second second-type active layer 602 being disposed at a side of the buffer layer 80 and the second first-type active layer 502 away from the base substrate 10; the second first-type active layer 502 includes a second first-type channel region 512 and a second source region 53, and the second second-type active layer 602 includes a second second-type channel region 612 and a second drain region 63, an orthographic projection of the second first-type channel region 512 on the base substrate 10 being completely overlapped with an orthographic projection of the second second-type channel region 612 on the base substrate 10, the second source region 53 being located at a side of the second tunneling field active layer, and the second drain region 63 being located at another side of the second tunneling field active layer; a first gate insulating layer 71 disposed at a side of the first tunneling field active layer away from the base substrate 10 and a second gate insulating layer 72 disposed at a side of the second tunneling field active layer away from the base substrate 10; a first conductive layer disposed at a side of the first gate insulating layer 71 and the second gate insulating layer 72 away from the base substrate 10, wherein the first conductive layer at least includes a first gate electrode 21 and a second gate electrode 22, the first gate electrode 21 being disposed at a side of the first gate insulating layer 71 away from the base substrate 10, and the second gate electrode 22 being disposed at a side of the second gate insulating layer 72 away from the base substrate 10; as well as a second conductive layer, wherein the second conductive layer at least includes a first source electrode 31, a first drain electrode 41, a second source electrode 32, and a second drain electrode 42, the first source electrode 31 being connected with the first source region 52 of the first tunneling field active layer, the first drain electrode 41 being connected with the first drain region 62 of the first tunneling field active layer, the second source electrode 32 being connected with the second source region 53 of the second tunneling field active layer, and the second drain electrode 42 being connected with the second drain region 63 of the second tunneling field active layer.

In some other exemplary embodiments, the first tunneling field effect transistor T1 and the second tunneling field effect transistor T2 may both be in a bottom gate structure; or, one of the first tunneling field effect transistor T1 and the second tunneling field effect transistor T2 is in a top gate structure and the other is in a bottom gate structure.

Figure 5:
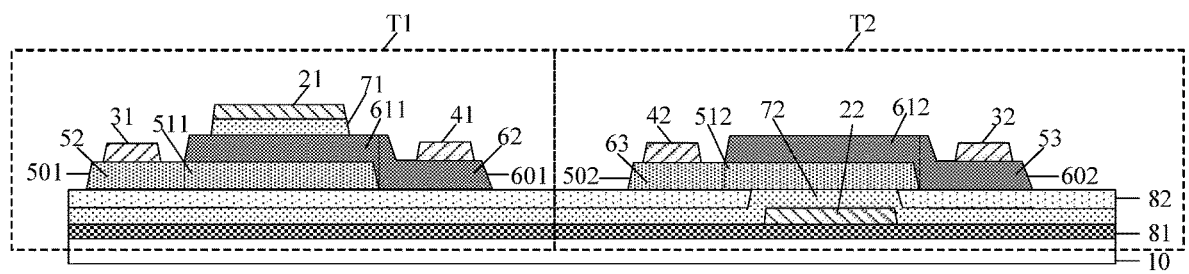
FIG. 5 is a schematic diagram of a structure of yet another tunneling field effect transistor according to an exemplary embodiment of the present disclosure.

FIG. 5 is a schematic diagram of a structure of yet another tunneling field effect transistor according to an exemplary embodiment of the present disclosure. As shown in FIG. 5, the tunneling field effect transistor may be in a planar-type dual TFET structure, and may include a first tunneling field effect transistor T1 and a second tunneling field effect transistor T2, wherein the first tunneling field effect transistor T1 may include a first gate electrode 21, a first tunneling field active layer, a first source electrode 31, and a first drain electrode 41, and the second tunneling field effect transistor T2 may include a second gate electrode 22, a second tunneling field active layer, a second source electrode 32, and a second drain electrode 42; and the first tunneling field effect transistor T1 may be in a top gate structure, and the second tunneling field effect transistor T2 may be in a bottom gate structure.

As shown in FIG. 5, the tunneling field effect transistor may include: a first buffer layer 81 disposed at a side of the base substrate 10 and a first conductive layer disposed at a side of the first buffer layer 81 away from the base substrate 10, the first conductive layer at least including a second gate electrode 22; a second gate insulating layer 72 covering the first conductive layer and a second buffer layer 82 disposed at a side of the first buffer layer 81 away from the base substrate 10 and covering the second gate insulating layer 72; a semiconductor layer disposed at a side of the second buffer layer 82 away from the base substrate 10, the semiconductor layer at least including a first tunneling field active layer and a second tunneling field active layer;

wherein, the first tunneling field active layer includes a first first-type active layer 501 and a first second-type active layer 601 that are stacked, the first first-type active layer 501 being disposed at a side of the second buffer layer 82 away from the base substrate 10, and the first second-type active layer 601 being disposed at a side of the second buffer layer 82 and the first first-type active layer 501 away from the base substrate 10; the first first-type active layer 501 includes a first first-type channel region 511 and a first source region 52, and the first second-type active layer 601 includes a first second-type channel region 611 and a first drain region 62, an orthographic projection of the first first-type channel region 511 on the base substrate 10 being completely overlapped with an orthographic projection of the first second-type channel region 611 on the base substrate 10, the first source region 52 being located at a side of the first tunneling field active layer, and the first drain region 62 being located at another side of the first tunneling field active layer; the second tunneling field active layer includes a second first-type active layer 502 and a second second-type active layer 602 that are stacked, the second first-type active layer 502 being disposed at a side of the second gate insulating layer 72 away from the base substrate 10, and the second second-type active layer 602 being disposed at a side of the second buffer layer 82 and the second first-type active layer 502 away from the base substrate 10; the second first-type active layer 502 includes a second first-type channel region 512 and a second drain region 63, and the second second-type active layer 602 includes a second second-type channel region 612 and a second source region 53, an orthographic projection of the second first-type channel region 512 on the base substrate 10 being completely overlapped with an orthographic projection of the second second-type channel region 612 on the base substrate 10, the second source region 53 being located at a side of the second tunneling field active layer, and the second drain region 63 being located at another side of the second tunneling field active layer; a first gate insulating layer 71 disposed at a side of the first tunneling field active layer away from the base substrate 10; a second conductive layer disposed at a side of the first gate insulating layer 71 away from the base substrate 10, the second conductive layer at least including the first gate electrode 21; as well as a third conductive layer, wherein the third conductive layer at least includes a first source electrode 31, a first drain electrode 41, a second source electrode 32, and a second drain electrode 42, the first source electrode 31 being connected with the first source region 52 of the first tunneling field active layer, the first drain electrode 41 being connected with the first drain region 62 of the first tunneling field active layer, the second source electrode 32 being connected with the second source region 53 of the second tunneling field active layer, and the second drain electrode 42 being connected with the second drain region 63 of the second tunneling field active layer.

In an exemplary embodiment of the present disclosure, the tunneling field effect transistor may include a first tunneling field effect transistor and a second tunneling field effect transistor, wherein the first tunneling field effect transistor may include a first gate electrode, a first tunneling field active layer, a first source electrode, and a first drain electrode disposed on the base substrate, and the second tunneling field effect transistor may include a second gate electrode, a second tunneling field active layer, a second source electrode, and a second drain electrode disposed at a side of the first tunneling field effect transistor away from the base substrate. At this time, the tunneling field effect transistor may be regarded to be in a vertical-type dual TFET structure.

In an exemplary embodiment of the present disclosure, the first tunneling field active layer may include a first first-type active layer and a first second-type active layer that are stacked, wherein the first first-type active layer includes a first first-type channel region and a first source-drain region, the first second-type active layer includes a first second-type channel region and a second source-drain region, one of the first source-drain region and the second source-drain region is a first source region and the other is a first drain region; an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode; the second tunneling field active layer may include a second first-type active layer and a second second-type active layer that are stacked, wherein the second first-type active layer includes a second first-type channel region and a third source-drain region, the second second-type active layer includes a second second-type channel region and a fourth source-drain region, one of the third source-drain region and the fourth source-drain region is a second source region and the other is a second drain region; an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

Figure 6:
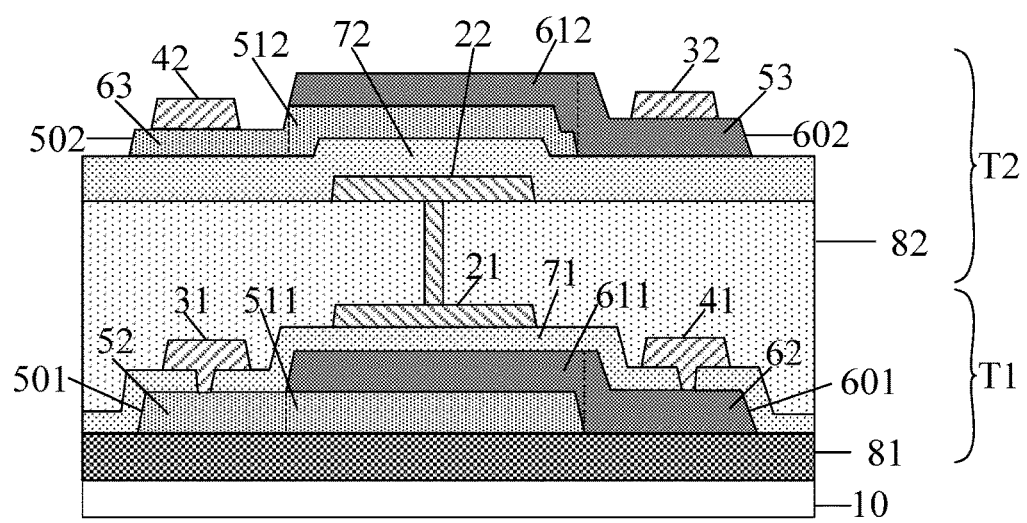
FIG. 6 is a schematic diagram of a structure of yet another tunneling field effect transistor according to an exemplary embodiment of the present disclosure.

FIG. 6 is a schematic diagram of a structure of yet another tunneling field effect transistor according to an exemplary embodiment of the present disclosure. As shown in FIG. 6, the tunneling field effect transistor is in a vertical-type dual TFET structure, and may include a first tunneling field effect transistor T1 and a second tunneling field effect transistor T2, wherein the first tunneling field effect transistor T1 may be in a top gate structure, and the second tunneling field effect transistor T2 may be in a bottom gate structure.

As shown in FIG. 6, the first tunneling field effect transistor T1 may include: a first buffer layer 81, a first tunneling field active layer, a first gate insulating layer 71, a first gate electrode 21, a first source electrode 31, and a first drain electrode 41 disposed on the base substrate 10; wherein the first buffer layer 81 is disposed at a side of the base substrate 10, the first tunneling field active layer is disposed at a side of the first buffer layer 81 away from the base substrate 10, the first tunneling field active layer includes a first first-type active layer 501 and a first second-type active layer 601 that are stacked, wherein the first first-type active layer 501 is disposed at a side of the first buffer layer 81 away from the base substrate 10, and the first second-type active layer 601 is disposed at a side of the first buffer layer 81 and the first first-type active layer 501 away from the base substrate 10; the first first-type active layer 501 includes a first first-type channel region 511 and a first source region 52, and the first second-type active layer 601 includes a first second-type channel region 611 and a first drain region 62, wherein an orthographic projection of the first first-type channel region 511 on the base substrate 10 is completely overlapped with an orthographic projection of the first second-type channel region 611 on the base substrate 10, the first source region 52 is located at a side of the first tunneling field active layer and is connected to the first source electrode 31, and the first drain region 62 is located at another side of the first tunneling field active layer and is connected to the first drain electrode 41; the first gate insulating layer 71 is disposed at a side of the first tunneling field active layer away from the base substrate 10 and covers the first tunneling field active layer, the first gate electrode 21 is disposed at a side of the first gate insulating layer 71 away from the base substrate 10, and an orthographic projection of the first gate electrode 21 on the base substrate 10 is located within a range of an orthographic projection of the first first-type channel region 511 and the first second-type channel region 611 on the base substrate 10; the second tunneling field effect transistor T2 may include: a second buffer layer 82, a second tunneling field active layer, a second gate insulating layer 72, a second gate electrode 22, a second source electrode 32, and a second drain electrode 42; wherein the second buffer layer 82 is disposed at a side of the first tunneling field effect transistor T1 away from the base substrate 10 and covers the first tunneling field effect transistor T1, the second gate electrode 22 is disposed at a side of the second buffer layer 82 away from the base substrate 10, the second gate insulating layer 72 is disposed at a side of the second buffer layer 82 away from the base substrate 10 and covers the second gate electrode 22, the second tunneling field active layer is disposed at a side of the second gate insulating layer 72 away from the base substrate 10, the second tunneling field active layer includes a second first-type active layer 502 and a second second-type active layer 602 that are stacked, wherein the second first-type active layer 502 is disposed at a side of the second gate insulating layer 72 away from the base substrate 10, and the second second-type active layer 602 is disposed at a side of the second gate insulating layer 72 and the second first-type active layer 502 away from the base substrate 10; the second first-type active layer 502 includes a second first-type channel region 512 and a second drain region 63, and the second second-type active layer 602 includes a second second-type channel region 612 and a second source region 53, wherein an orthographic projection of the second first-type channel region 512 on the base substrate 10 is completely overlapped with an orthographic projection of the second second-type channel region 612 on the base substrate 10, the second source region 53 is located at a side of the second tunneling field active layer and is connected with the second source electrode 32, and the second drain region 63 is located at another side of the second tunneling field active layer and is connected with the second drain electrode 42; and an orthographic projection of the second gate electrode 22 on the base substrate 10 is located within a range of an orthographic projection of the second first-type channel region 512 and the second second-type channel region 612 on the base substrate 10.

In some other exemplary embodiments, the first tunneling field effect transistor may be in a bottom gate structure, the second tunneling field effect transistor may be in a top gate structure, or, the first tunneling field effect transistor and the second tunneling field effect transistor are both in a top gate structure or a bottom gate structure.

In an exemplary embodiment of the present disclosure, the first-type active layer (including a first first-type active layer and a second first-type active layer) may be a P-type semiconductor active layer, and the second-type active layer (including a first second-type active layer and a second second-type active layer) may be an N-type metal oxide semiconductor active layer; or, the first-type active layer may be an N-type metal oxide semiconductor active layer, and the second-type active layer may be a P-type semiconductor active layer. A band gap of the metal oxide semiconductor active layer is relatively large, so an Ioff of the tunneling field effect transistor can be made to be relatively low; moreover, since conduction of an N-type carrier can be achieved in the metal oxide semiconductor active layer, a structure of a drain junction can be simplified.

In an exemplary embodiment of the present disclosure, a material of the P-type semiconductor active layer may include any one or more of P-type semiconductor materials containing an IV-th main group element. When a P-type semiconductor material containing the IV-th main group element is adopted to form the P-type semiconductor active layer, it is beneficial to reduce an edge energy of the conduction band, and it is easy to achieve a double-layer structure under a CMOS platform.

In an exemplary embodiment of the present disclosure, the material of the P-type semiconductor active layer may include any one or more of P-type doped Si, P-type doped Ge, and P-type doped SiGe.

In an exemplary embodiment of the present disclosure, the material of the N-type metal oxide semiconductor active layer may include any one or more of a metal oxide composed of at least two metals of indium (In), gallium (Ga), zinc (Zn), and tin (Sn). When the metal oxide composed of at least two metals of indium (In), gallium (Ga), zinc (Zn), and tin (Sn) is adopted to form the N-type metal oxide semiconductor active layer, it is beneficial to reduce the edge energy of the conduction band, and it is easy to achieve the double-layer structure under the CMOS platform.

In an exemplary embodiment of the present disclosure, the material of the N-type metal oxide semiconductor active layer may include any one or more of Indium Gallium Zinc Oxide (IGZO), Indium Gallium Tin Oxide (IGTO), Indium Zinc Oxide (IZO), Indium Tin Zinc Oxide (ITZO), Indium Tin oxide (ITO), Indium Gallium Zinc Tin Oxide (IGZTO), and Zinc Tin Oxide (ZTO).

In an exemplary embodiment of the present disclosure, the metal oxide may also contain any one or more of tungsten (Wu), tantalum (Ta), and a lanthanide element (e.g. praseodymium (Pr), etc.).

In an exemplary embodiment of the present disclosure, in a same tunneling field active layer, a total thickness of the first-type channel region and the second-type channel region may be 110 nm to 1100 nm, for example, may be 110 nm, 200 nm, 300 nm, 400 nm, 500 nm, 600 nm, 700 nm, 800 nm, 900 nm, 1000 nm, or 1100 nm.

In an exemplary embodiment of the present disclosure, in a same tunneling field active layer, a length of the first-type channel region is equal to a length of the second-type channel region, and lengths of the first-type channel region and the second-type channel region may both be 7 nm to 15 nm, for example, may both be 7 nm, 8 nm, 9 nm, 10 nm, 11 nm, 12 nm, 13 nm, 14 nm, or 15 nm.

In the description of the present disclosure, in the same tunneling field active layer, the lengths of the first-type channel region and the second-type channel region may be a distance between an orthographic projection of the first source region on the base substrate and an orthographic projection of the first drain region on the base substrate (or, a distance between an orthographic projection of the second source region on the base substrate and an orthographic projection of the second drain region on the base substrate).

An embodiment of the present disclosure also provides a manufacturing method for a tunneling field effect transistor, including: a gate electrode, a tunneling field active layer, a first electrode, and a second electrode are formed on a base substrate; wherein the tunneling field active layer includes a first-type active layer and a second-type active layer that are stacked, wherein the first-type active layer includes a first-type channel region and a first source-drain region, the second-type active layer includes a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode, the second source-drain region is located at another side of the tunneling field active layer and is connected with the second electrode, and an orthographic projection of the gate electrode on the base substrate is located within a range of an orthographic projection of the first-type channel region and the second-type channel region on the base substrate.

The tunneling field effect transistor provided by the embodiment of the present disclosure may be obtained by the manufacturing method for a tunneling field effect transistor as provided in the above embodiment of the present disclosure.

FIG. 7 is a process flow chart of a method for manufacturing a tunneling field effect transistor according to an exemplary embodiment of the present disclosure. As shown in FIG. 7, in an exemplary embodiment of the present disclosure, when the tunneling field effect transistor is a top gate structure, the manufacturing method may include: a tunneling field active layer is formed on the base substrate, wherein the tunneling field active layer includes a first-type active layer and a second-type active layer that are stacked, the first-type active layer includes a first-type channel region and a first source region, the second-type active layer includes a second-type channel region and a first drain region, an orthographic projection of the first-type channel region on the base substrate is completely overlapped with an orthographic projection of the second-type channel region on the base substrate, the first source region is located at a side of the tunneling field active layer, and the first drain region is located at another side of the tunneling field active layer; a gate electrode is formed at a side of the tunneling field active layer (the second-type channel region) away from the base substrate; and a source electrode and a drain electrode are formed at a side of the first source region and the first drain region of the tunneling field active layer away from the base substrate, respectively.

FIGS. 8A to 8C are process flow charts of a method for manufacturing another tunneling field effect transistor according to an exemplary embodiment of the present disclosure. As shown in FIGS. 8A to 8C and FIG. 2, in an exemplary embodiment of the present disclosure, when the tunneling field effect transistor is in a top gate structure, the manufacturing method may include: a buffer thin film and a first-type semiconductor thin film are sequentially deposited at a side of the base substrate 10, and the first-type semiconductor thin film is patterned and processed to form a buffer layer 80 disposed on the base substrate 10 and a first-type active layer 50 disposed at a side of the buffer layer 80 away from the base substrate 10, as shown in FIG. 8A; a second-type semiconductor thin film is deposited on the base substrate 10 on which the aforementioned pattern is formed, and the second-type semiconductor thin film is patterned and processed to form a second-type active layer 60 disposed at a side of the buffer layer 80 and the first-type active layer 50 away from the base substrate 10, wherein the first-type active layer 50 and the second-type active layer 60 constitute a tunneling field active layer, the first-type active layer 50 includes a first-type channel region 51 and a first source region 52, the second-type active layer 60 includes a second-type channel region 61 and a first drain region 62, an orthographic projection of the first-type channel region 51 on the base substrate 10 is completely overlapped with an orthographic projection of the second-type channel region 61 on the base substrate 10, the first source region 52 is located at a side of the tunneling field active layer, and the first drain region 62 is located at another side of the tunneling field active layer, as shown in FIG. 8B; a gate insulating thin film and a gate metal thin film are sequentially deposited on the base substrate 10 on which the aforementioned pattern is formed, and the gate insulating thin film and the gate metal thin film are patterned and processed to form the gate insulating layer 70 disposed at a side of the second-type channel region 61 away from the base substrate 10 and the gate electrode 20 disposed at a side of the gate insulating layer 70 away from the base substrate 10, wherein an orthographic projection of the gate electrode 20 on the base substrate 10 is located within a range of an orthographic projection of the first-type channel region 51 and the second-type channel region 61 on the base substrate 10, as shown in FIG. 8C (generally, the gate insulating layer and the gate electrode of a same size may be formed by one-time patterning, and if sizes of the gate insulating layer and the gate electrode are different, the gate insulating layer and the gate electrode may be formed in a halftone mode); a source-drain metal thin film is deposited on the base substrate 10 on which the aforementioned pattern is formed, and the source-drain metal thin film is patterned and processed to form the source electrode 30 at a side of the first source region 52 away from the base substrate 10 and the drain electrode 40 at a side of the first drain region 62 away from the base substrate 10, as shown in FIG. 2.

Figure 9:
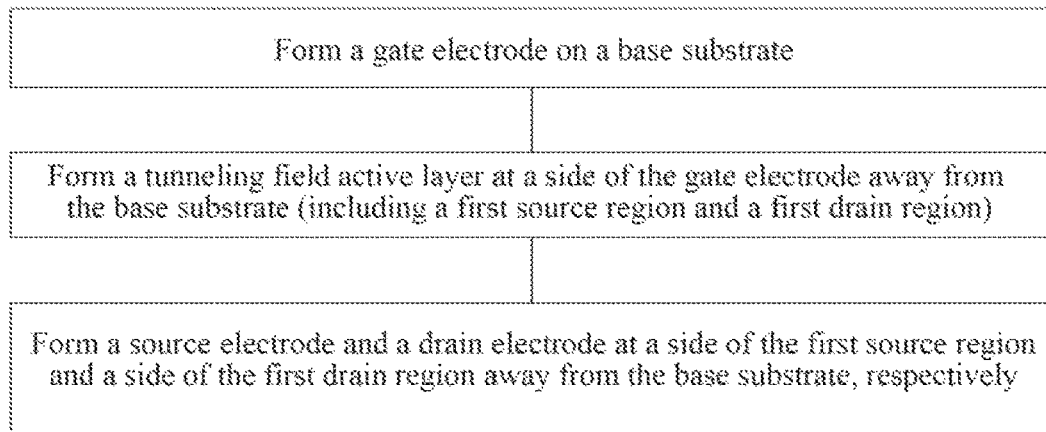
FIG. 9 is a process flow chart of a method for manufacturing yet another tunneling field effect transistor according to an exemplary embodiment of the present disclosure.

FIG. 9 is a process flow chart of a method for manufacturing yet another tunneling field effect transistor according to an exemplary embodiment of the present disclosure. As shown in FIG. 9, in an exemplary embodiment of the present disclosure, when the tunneling field effect transistor is in a bottom gate structure, the manufacturing method may include: a gate electrode is formed on the base substrate; a tunneling field active layer is formed at a side of the gate electrode away from the base substrate, wherein the tunneling field active layer includes a first-type active layer and a second-type active layer that are stacked, the first-type active layer includes a first-type channel region and a first drain region, the second-type active layer includes a second-type channel region and a first source region, an orthographic projection of the first-type channel region on the base substrate is completely overlapped with an orthographic projection of the second-type channel region on the base substrate, the first source region is located at a side of the tunneling field active layer, the first drain region is located at another side of the tunneling field active layer, and an orthographic projection of the gate electrode on the base substrate is located within a range of an orthographic projection of the first-type channel region and the second-type channel region on the base substrate; a source electrode and a drain electrode are formed at a side of the first source region and the first drain region of the tunneling field active layer away from the base substrate, respectively.

Figure 10A:
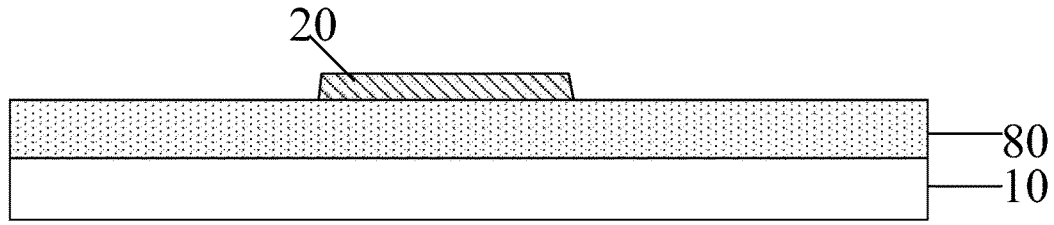
FIGS. 10A to 10C are process flow charts of a method for manufacturing yet another tunneling field effect transistor according to an exemplary embodiment of the present disclosure.
Figure 10B:
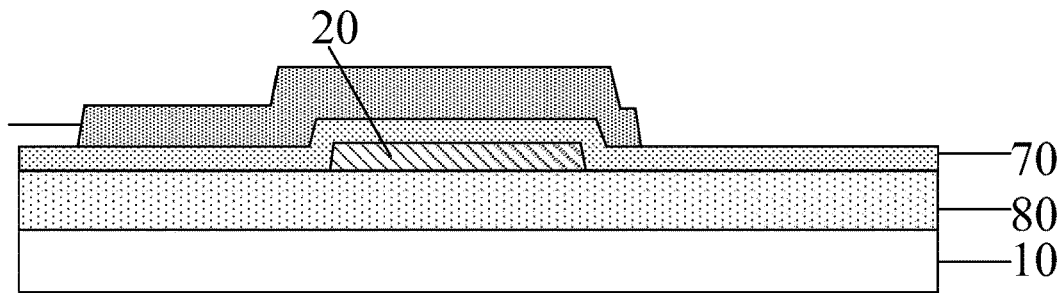
Figure 10C:
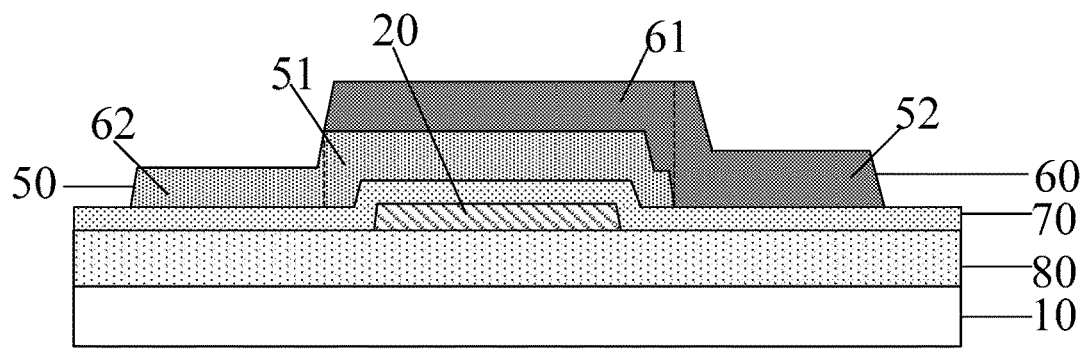

FIGS. 10A to 10C are process flow charts of a method for manufacturing yet another tunneling field effect transistor according to an exemplary embodiment of the present disclosure. As shown in FIGS. 10A to 10C and FIG. 3, in an exemplary embodiment of the present disclosure, when the tunneling field effect transistor is in a bottom gate structure, the manufacturing method may include: the gate electrode 20 is formed on the base substrate 10, including: a buffer thin film and a gate metal thin film are sequentially deposited at a side of the base substrate 10, and the gate metal thin film is patterned and processed to form the buffer layer 80 disposed on the base substrate 10 and the gate electrode 20 disposed at a side of the buffer layer 80 away from the base substrate 10, as shown in FIG. 10A; a gate insulating thin film and a first-type semiconductor thin film are sequentially deposited on the base substrate 10 on which the aforementioned pattern is formed, and the first-type semiconductor thin film is patterned and processed to form the gate insulating layer 70 covering the gate electrode 20 and the first-type active layer 50 disposed at a side of the gate insulating layer 70 away from the base substrate 10, as shown in FIG. 10B; a second-type semiconductor thin film is deposited on the base substrate 10 on which the aforementioned pattern is formed, and the second-type semiconductor thin film is patterned and processed to form the second-type active layer 60 disposed at a side of the gate insulating layer 70 and the first-type active layer 50 away from the base substrate 10, the first-type active layer 50 and the second-type active layer 60 constituting a tunneling field active layer. Among them, the first-type active layer 50 includes the first-type channel region 51 and the first drain region 62, and the second-type active layer 60 includes the second-type channel region 61 and the first source region 52, an orthographic projection of the first-type channel region 51 on the base substrate 10 is completely overlapped with an orthographic projection of the second-type channel region 61 on the base substrate 10, the first source region 52 is located at a side of the tunneling field active layer, the first drain region 62 is located at another side of the tunneling field active layer, and an orthographic projection of the gate electrode 20 on the base substrate 10 is located within a range of an orthographic projection of the first-type channel region 51 and the second-type channel region 61 on the base substrate 10, as shown in FIG. 10C; a source-drain metal thin film is deposited on the base substrate 10 on which the aforementioned pattern is formed, and the source-drain metal thin film is patterned and processed to form the source electrode 30 at a side of the first source region 52 away from the base substrate 10 and the drain electrode 40 at a side of the first drain region 62 away from the base substrate 10, as shown in FIG. 3.

In an exemplary embodiment of the present disclosure, when the tunneling field effect transistor is in a planar-type dual TFET structure, the manufacturing method may include: a first gate electrode, a first tunneling field active layer, a first source electrode, and a first drain electrode are formed on the base substrate to obtain a first tunneling field effect transistor; and a second gate electrode, a second tunneling field active layer, a second source electrode, and a second drain electrode are formed on the base substrate to obtain a second tunneling field effect transistor; wherein, the first tunneling field active layer may include a first first-type active layer and a first second-type active layer that are stacked, wherein the first first-type active layer includes a first first-type channel region and a first source-drain region, the first second-type active layer includes a first second-type channel region and a second source-drain region, one of the first source-drain region and the second source-drain region is a first source region and the other is a first drain region; an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode; the second tunneling field active layer may include a second first-type active layer and a second second-type active layer that are stacked, wherein the second first-type active layer includes a second first-type channel region and a third source-drain region, the second second-type active layer includes a second second-type channel region and a fourth source-drain region, one of the third source-drain region and the fourth source-drain region is a second source region and the other is a second drain region; an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

Figure 11A:
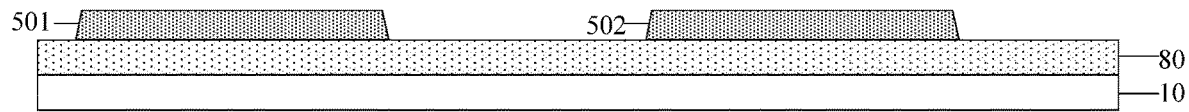
FIGS. 11A to 11C are process flow charts of a method for manufacturing yet another tunneling field effect transistor according to an exemplary embodiment of the present disclosure.
Figure 11B:
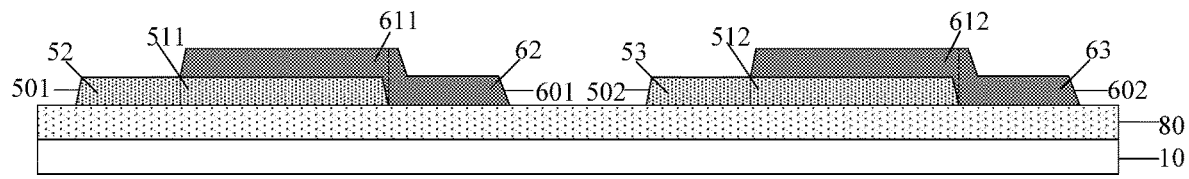
Figure 11C:
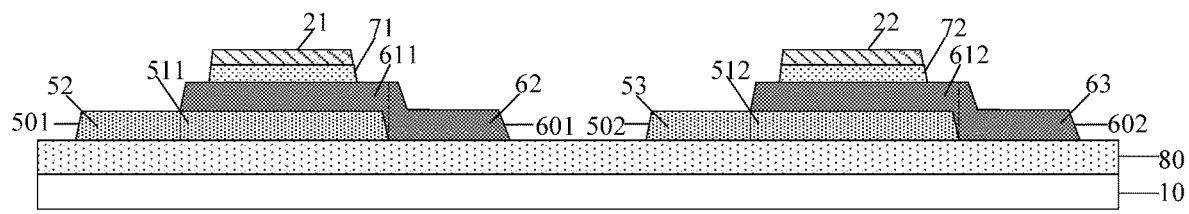

FIGS. 11A to 11C are process flow charts of a method for manufacturing yet another tunneling field effect transistor according to an exemplary embodiment of the present disclosure. As shown in FIGS. 11A to 11C and FIG. 4, in an exemplary embodiment of the present disclosure, when the tunneling field effect transistor has a planar-type dual TFET structure and the first tunneling field effect transistor T1 and the second tunneling field effect transistor T2 are both in a top gate structure, the manufacturing method may include: a buffer thin film and a first-type semiconductor thin film are sequentially deposited at a side of the base substrate 10, and the first-type semiconductor thin film is patterned and processed to form the buffer layer 80 disposed at a side of the base substrate 10 and a first-type semiconductor layer disposed at a side of the buffer layer 80 away from the base substrate 10, wherein the first-type semiconductor layer may include the first first-type active layer 501 and the second first-type active layer 502, as shown in FIG. 11A; a second-type semiconductor thin film is deposited on the base substrate 10 on which the aforementioned pattern is formed, and the second-type semiconductor thin film is patterned and processed to form a second-type semiconductor layer disposed at a side of the buffer layer 80 and the first-type semiconductor layer away from the base substrate 10, wherein the second-type semiconductor layer may include a first second-type active layer 601 and a second second-type active layer 602, the first second-type active layer 601 is disposed at a side of the buffer layer 80 and the first first-type active layer 501 away from the base substrate 10, the first first-type active layer 501 and the first second-type active layer 601 constitute a first tunneling field active layer, the second second-type active layer 602 is disposed at a side of the buffer layer 80 and the second first-type active layer 502 away from the base substrate 10, the second first-type active layer 502 and the second second-type active layer 602 constitute a second tunneling field active layer; the first first-type active layer 501 includes a first first-type channel region 511 and a first source region 52, and the first second-type active layer 601 includes the first second-type channel region 611 and the first drain region 62, wherein an orthographic projection of the first first-type channel region 511 on the base substrate 10 is completely overlapped with an orthographic projection of the first second-type channel region 611 on the base substrate 10, the first source region 52 is located at a side of the first tunneling field active layer, and the first drain region 62 is located at another side of the first tunneling field active layer; the second first-type active layer 502 includes the second first-type channel region 512 and the second drain region 63, and the second second-type active layer 602 includes the second second-type channel region 612 and the second source region 53, wherein an orthographic projection of the second first-type channel region 512 on the base substrate 10 is completely overlapped with an orthographic projection of the second second-type channel region 612 on the base substrate 10, the second source region 53 is located at a side of the second tunneling field active layer, and the second drain region 63 is located at another side of the second tunneling field active layer, as shown in FIG. 11B; a gate insulating thin film and a first conductive thin film (a gate metal thin film) are sequentially deposited on the base substrate 10 on which the aforementioned pattern is formed, and the gate insulating thin film and the first conductive thin film are patterned and processed to form the first gate insulating layer 71 and the second gate insulating layer 72 respectively disposed at a side of the first second-type channel region 611 and the second second-type channel region 612 away from the base substrate 10, and the first gate electrode 21 and the second gate electrode 22 respectively disposed at a side of the first gate insulating layer 71 and the second gate insulating layer 72 away from the base substrate 10, wherein the first gate electrode 21 and the second gate electrode 22 constitute a first conductive layer, an orthographic projection of the first gate electrode 21 on the base substrate 10 is located within a range of an orthographic projection of the first first-type channel region 511 and the first second-type channel region 611 on the base substrate 10, and an orthographic projection of the second gate electrode 22 on the base substrate 10 is located within a range of an orthographic projection of the second first-type channel region 512 and the second second-type channel region 612 on the base substrate 10, as shown in FIG. 11C; a second conductive thin film is deposited on the base substrate 10 on which the aforementioned pattern is formed, and the second conductive thin film is patterned and processed to form a second conductive layer, wherein the second conductive layer may include the first source electrode 31, the first drain electrode 41, the second source electrode 32, and the second drain electrode 42, the first source electrode 31 is disposed at a side of the first source region 52 away from the base substrate 10 and is connected with the first source region 52, the first drain electrode 41 is disposed at a side of the first drain region 62 away from the base substrate 10 and is connected with the first drain region 62, the second source electrode 32 is disposed at a side of the second source region 53 away from the base substrate 10 and is connected with the second source region 53, and the second drain electrode 42 is disposed at a side of the second drain region 63 away from the base substrate 10 and is connected with the second drain region 63, as shown in FIG. 4.

Figure 12A:
FIGS. 12A to 12D are process flow charts of a method for manufacturing yet another tunneling field effect transistor according to an exemplary embodiment of the present disclosure.
Figure 12B:
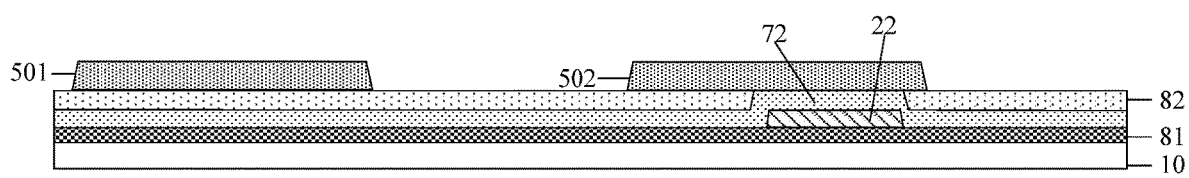
Figure 12C:
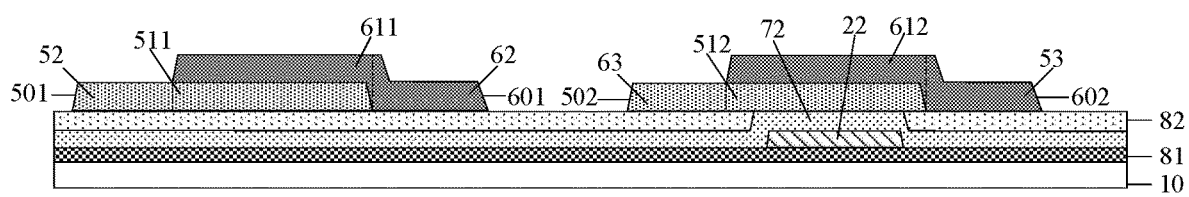
Figure 12D:
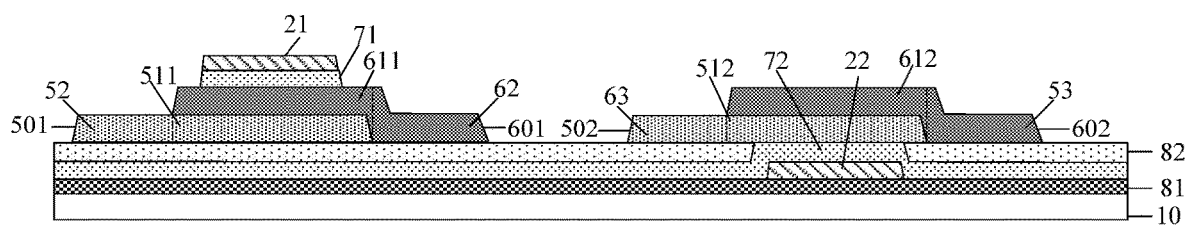

FIGS. 12A to 12D are process flow charts of a method for manufacturing yet another tunneling field effect transistor according to an exemplary embodiment of the present disclosure. As shown in FIGS. 12A to 12D and FIG. 5, in an exemplary embodiment of the present disclosure, when the tunneling field effect transistor is a planar-type dual TFET structure and the first tunneling field effect transistor T1 is in a top gate structure and the second tunneling field effect transistor T2 is in a bottom gate structure, the manufacturing method may include: a first buffer thin film and a first conductive thin film are sequentially deposited at a side of the base substrate 10, and the first conductive thin film is patterned and processed to form the first buffer layer 81 disposed on the base substrate 10 and a first conductive layer disposed at a side of the first buffer layer 81 away from the base substrate 10, wherein the first conductive layer may include a second gate electrode 22, as shown in FIG. 12A; a second gate insulating thin film, a second buffer thin film, and a first-type semiconductor thin film are sequentially deposited on the base substrate 10 on which the aforementioned pattern is formed, and the first-type semiconductor thin film is patterned and processed to form the second gate insulating layer 72 covering the second gate electrode 22, the second buffer layer 82 covering the second gate insulating layer 72, and a first-type semiconductor layer disposed at a side of the second buffer layer 82 away from the base substrate 10, wherein the first-type semiconductor layer may include a first first-type active layer 501 and a second first-type active layer 502, as shown in FIG. 12B; a second-type semiconductor thin film is deposited and formed on the base substrate 10 on which the aforementioned pattern is formed, and the second-type semiconductor thin film is patterned and processed to form a second-type semiconductor layer, wherein the second-type semiconductor layer may include the first second-type active layer 601 and the second second-type active layer 602, the first second-type active layer 601 is disposed at a side of the second buffer layer 82 and the first first-type active layer 501 away from the base substrate 10, the first first-type active layer 501 and the first second-type active layer 601 constitute a first tunneling field active layer, the second second-type active layer 602 is disposed at a side of the second buffer layer 82 and the second first-type active layer 502 away from the base substrate 10, the second first-type active layer 502 and the second second-type active layer 602 constitute a second tunneling field active layer; the first first-type active layer 501 includes the first first-type channel region 511 and the first source region 52, and the first second-type active layer 601 includes the first second-type channel region 611 and the first drain region 62, wherein an orthographic projection of the first first-type channel region 511 on the base substrate 10 is completely overlapped with an orthographic projection of the first second-type channel region 611 on the base substrate 10, the first source region 52 is located at a side of the first tunneling field active layer, and the first drain region 62 is located at another side of the first tunneling field active layer; the second first-type active layer 502 includes the second first-type channel region 512 and the second drain region 63, and the second second-type active layer 602 includes the second second-type channel region 612 and the second source region 53, wherein an orthographic projection of the second first-type channel region 512 on the base substrate 10 is completely overlapped with an orthographic projection of the second second-type channel region 612 on the base substrate 10, the second source region 53 is located at a side of the second tunneling field active layer, and the second drain region 63 is located at another side of the second tunneling field active layer, as shown in FIG. 12C; a first gate insulating thin film and a second conductive thin film are sequentially deposited on the base substrate 10 on which the aforementioned pattern is formed, and the first gate insulating thin film and the second conductive thin film are patterned and processed to form the first gate insulating layer 71 and a second conductive layer, wherein the first gate insulating layer 71 is disposed at a side of the first second-type channel region 611 away from the base substrate 10, the second conductive layer is disposed at a side of the first gate insulating layer 71 away from the base substrate 10, the second conductive layer may include the first gate electrode 21, and an orthographic projection of the first gate electrode 21 on the base substrate 10 is located within a range of an orthographic projection of the first first-type channel region 511 and the first second-type channel region 611 on the base substrate 10, as shown in FIG. 12D; a third conductive thin film is deposited on the base substrate 10 on which the aforementioned pattern is formed, and the third conductive thin film is patterned and processed to form a third conductive layer, wherein the third conductive layer may include a first source electrode 31, a first drain electrode 41, a second source electrode 32, and a second drain electrode 42, the first source electrode 31 is disposed at a side of the first source region 52 away from the base substrate 10 and is connected with the first source region 52, the first drain electrode 41 is disposed at a side of the first drain region 62 away from the base substrate 10 and is connected with the first drain region 62, the second source electrode 32 is disposed at a side of the second source region 53 away from the base substrate 10 and is connected with the second source region 53, and the second drain electrode 42 is disposed at a side of the second drain region 63 away from the base substrate 10 and is connected with the second drain region 63, as shown in FIG. 5.

In an exemplary embodiment of the present disclosure, when the tunneling field effect transistor has a vertical-type dual TFET structure, the manufacturing method may include: a first gate electrode, a first tunneling field active layer, a first source electrode, and a first drain electrode are formed on the base substrate to obtain a first tunneling field effect transistor; and a second gate electrode, a second tunneling field active layer, a second source electrode, and a second drain electrode are formed at a side of the first tunneling field effect transistor away from the base substrate to obtain a second tunneling field effect transistor; wherein, the first tunneling field active layer includes a first first-type active layer and a first second-type active layer that are stacked, wherein the first first-type active layer includes a first first-type channel region and a first source-drain region, the first second-type active layer includes a first second-type channel region and a second source-drain region, one of the first source-drain region and the second source-drain region is a first source region and the other is a first drain region; an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode; the second tunneling field active layer includes a second first-type active layer and a second second-type active layer that are stacked, wherein the second first-type active layer includes a second first-type channel region and a third source-drain region, the second second-type active layer includes a second second-type channel region and a fourth source-drain region, one of the third source-drain region and the fourth source-drain region is a second source region and the other is a second drain region; an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

Figure 13A:
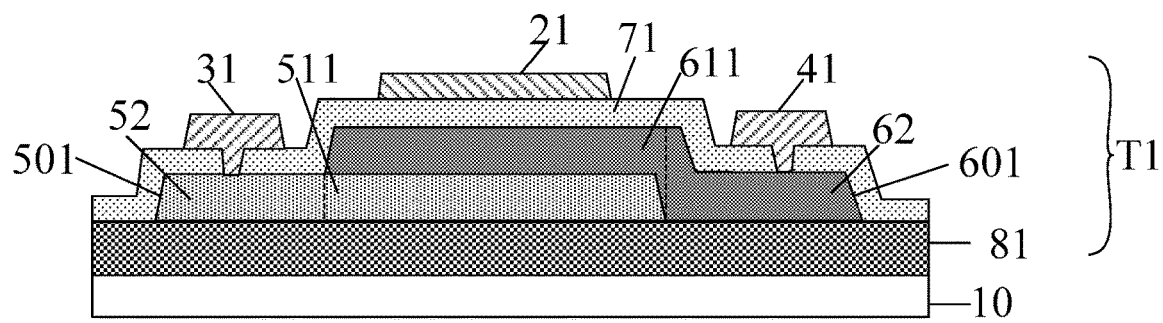
FIGS. 13A to 13D are process flow charts of a method for manufacturing yet another tunneling field effect transistor according to an exemplary embodiment of the present disclosure.
Figure 13B:
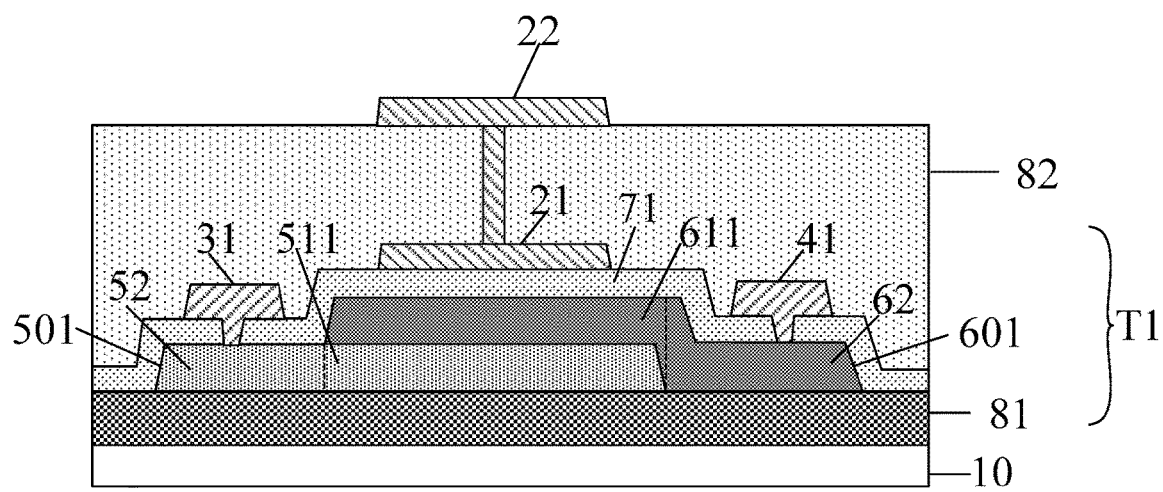
Figure 13C:
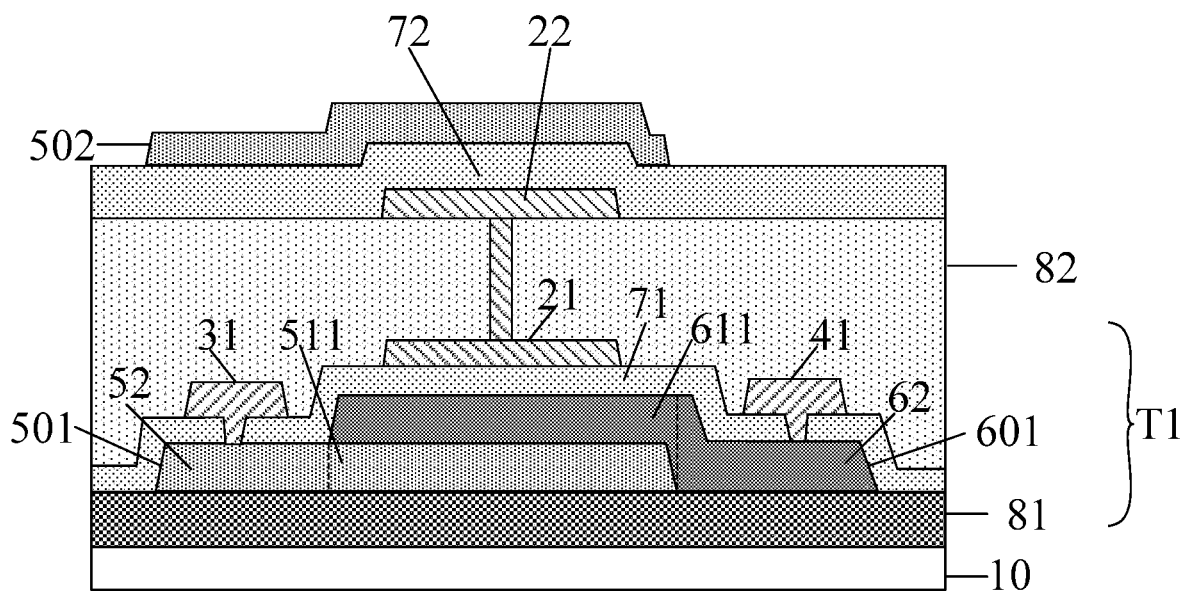
Figure 13D:
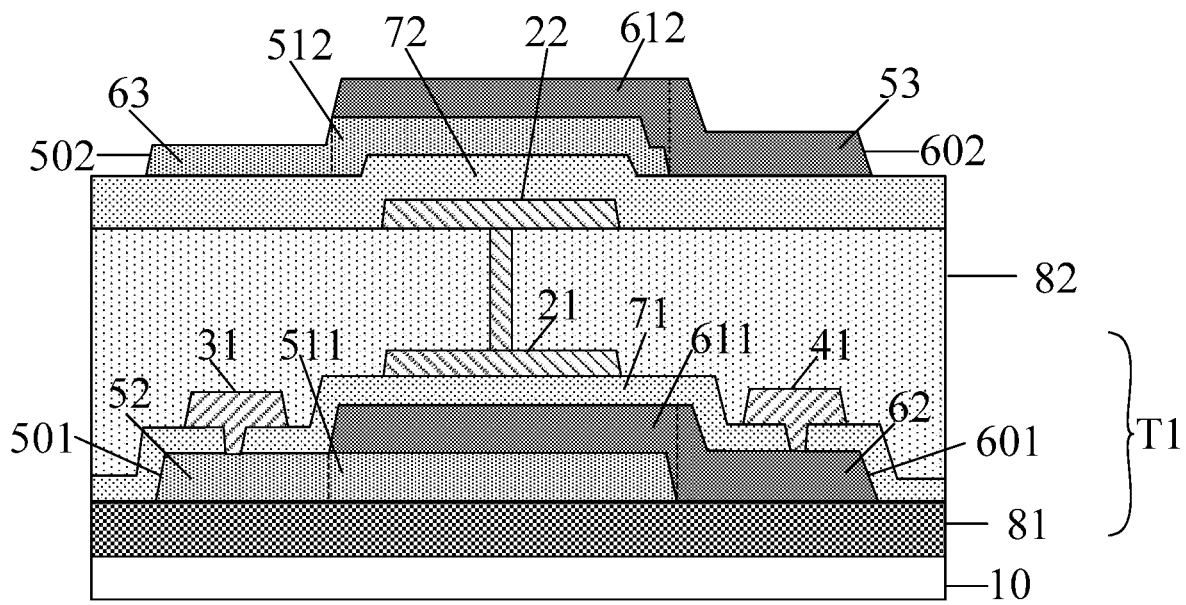

FIGS. 13A to 13D are process flow charts of a method for manufacturing yet another tunneling field effect transistor according to an exemplary embodiment of the present disclosure. As shown in FIGS. 13A to 13D and FIG. 6, in an exemplary embodiment of the present disclosure, when the tunneling field effect transistor is in a vertical-type dual TFET structure and the first tunneling field effect transistor T1 is in a top gate structure and the second tunneling field effect transistor T2 is in a bottom gate structure, the manufacturing method may include: a first tunneling field effect transistor T1 is formed on the base substrate 10, wherein the first tunneling field effect transistor T1 may include: a first buffer layer 81, a first tunneling field active layer, a first gate insulating layer 71, a first gate electrode 21, a first source electrode 31, and a first drain electrode 41 disposed on the base substrate 10; wherein the first buffer layer 81 is disposed at a side of the base substrate 10, the first tunneling field active layer is disposed at a side of the first buffer layer 81 away from the base substrate 10, the first tunneling field active layer includes a first first-type active layer 501 and a first second-type active layer 601 that are stacked, the first first-type active layer 501 is disposed at a side of the first buffer layer 81 away from the base substrate 10, and the first second-type active layer 601 is disposed at a side of the first buffer layer 81 and the first first-type active layer 501 away from the base substrate 10; the first first-type active layer 501 includes a first first-type channel region 511 and a first source region 52, and the first second-type active layer 601 includes a first second-type channel region 611 and a first drain region 62, an orthographic projection of the first first-type channel region 511 on the base substrate 10 is completely overlapped with an orthographic projection of the first second-type channel region 611 on the base substrate 10, the first source region 52 is located at a side of the first tunneling field active layer and is connected with the first source electrode 31, and the first drain region 62 is located at another side of the first tunneling field active layer and is connected with the first drain electrode 41; the first gate insulating layer 71 is disposed at a side of the first tunneling field active layer away from the base substrate 10 and covers the first tunneling field active layer, the first gate electrode 21 is disposed at a side of the first gate insulating layer 71 away from the base substrate 10, and an orthographic projection of the first gate electrode 21 on the base substrate 10 is located within a range of an orthographic projection of the first first-type channel region 511 and the first second-type channel region 611 on the base substrate 10; as shown in FIG. 13A; a buffer thin film and a gate metal thin film are sequentially deposited on the base substrate 10 on which the aforementioned pattern is formed, and the gate metal thin film is patterned and processed to form a second buffer layer 82 disposed at a side of the first tunneling field effect transistor T1 away from the base substrate 10 and covering the first tunneling field effect transistor T1, and a second gate electrode 22 disposed at a side of the second buffer layer 82 away from the base substrate 10 and connected with the first gate electrode 21, as shown in FIG. 13B; a gate insulating thin film and a first-type semiconductor thin film are sequentially deposited on the base substrate 10 on which the aforementioned pattern is formed, and the first-type semiconductor thin film is patterned and processed to form a second gate insulating layer 72 disposed at a side of the second buffer layer 82 away from the base substrate 10 and covering the second gate electrode 22, and a second first-type active layer 502 disposed at a side of the second gate insulating layer 72 away from the base substrate 10, as shown in FIG. 13C; a second-type semiconductor thin film is deposited on the base substrate 10 on which the aforementioned pattern is formed, and the second-type semiconductor thin film is patterned and processed to form a second second-type active layer 602 disposed at a side of the second buffer layer 82 and the second first-type active layer 502 away from the base substrate 10, and the second first-type active layer 502 and the second second-type active layer 602 constitute a second tunneling field active layer; the second first-type active layer 502 includes a second first-type channel region 512 and a second drain region 63, and the second second-type active layer 602 includes a second second-type channel region 612 and a second source region 53, wherein an orthographic projection of the second first-type channel region 512 on the base substrate 10 is completely overlapped with an orthographic projection of the second second-type channel region 612 on the base substrate 10, the second source region 53 is located at a side of the second tunneling field active layer, the second drain region 63 is located at another side of the second tunneling field active layer, and an orthographic projection of the second gate electrode 22 on the base substrate 10 is located within a range of an orthographic projection of the second first-type channel region 512 and the second second-type channel region 612 on the base substrate 10, as shown in FIG. 13D; a source-drain metal thin film is deposited on the base substrate 10 on which the aforementioned pattern is formed, and the source-drain metal thin film is patterned and processed to form a second drain electrode 42 at a side of the second drain region 63 away from the base substrate 10, and a second source electrode 32 at a side of the second source region 53 away from the base substrate 10, as shown in FIG. 6.

In the manufacturing method according to an exemplary embodiment of the present disclosure, the first-type active layer may be a P-type semiconductor active layer, and the second-type active layer may be an N-type metal oxide semiconductor active layer; or, the first-type active layer may be an N-type metal oxide semiconductor active layer, and the second-type active layer may be a P-type semiconductor active layer.

In the manufacturing method according to an exemplary embodiment of the present disclosure, a material of the P-type semiconductor active layer may include any one or more of P-type semiconductor materials containing an IV-th main group element.

In the manufacturing method according to an exemplary embodiment of the present disclosure, the material of the P-type semiconductor active layer may include any one or more of P-type doped Si, P-type doped Ge, and P-type doped SiGe.

In the manufacturing method according to an exemplary embodiment of the present disclosure, a material of the N-type metal oxide semiconductor active layer may include any one or more of a metal oxide composed of at least two metals of indium (In), gallium (Ga), zinc (Zn), and tin (Sn).

In the manufacturing method according to an exemplary embodiment of the present disclosure, the material of the N-type metal oxide semiconductor active layer may include any one or more of Indium Gallium Zinc Oxide (IGZO), Indium Gallium Tin Oxide (IGTO), Indium Zinc Oxide (IZO), Indium Tin Zinc Oxide (ITZO), Indium Tin oxide (ITO), Indium Gallium Zinc Tin Oxide (IGZTO), and Zinc Tin Oxide (ZTO).

In the manufacturing method according to an exemplary embodiment of the present disclosure, the metal oxide may also contain any one or more of tungsten (Wu), tantalum (Ta), and a lanthanide element (e.g. praseodymium (Pr), etc.).

In the manufacturing method according to an exemplary embodiment of the present disclosure, in a same tunneling field active layer, a total thickness of the first-type channel region and the second-type channel region may be 110 nm to 1100 nm, for example, may be 110 nm, 200 nm, 300 nm, 400 nm, 500 nm, 600 nm, 700 nm, 800 nm, 900 nm, 1000 nm, or 1100 nm.

In the manufacturing method according to an exemplary embodiment of the present disclosure, in a same tunneling field active layer, lengths of the first-type channel region and the second-type channel region may both be 7 nm to 15 nm, for example, may both be 7 nm, 8 nm, 9 nm, 10 nm, 1 mm, 12 nm, 13 nm, 14 nm, or 15 nm.

In an exemplary embodiment of the present disclosure, a thickness of the P-type semiconductor active layer may be 1000 Å to 10000 Å.

In an exemplary embodiment of the present disclosure, a thickness of the N-type metal oxide semiconductor active layer may be 100 Å to 1000 Å.

In an exemplary embodiment of the present disclosure, the first electrode and the second electrode (including a first source electrode, a first drain electrode, a second source electrode, and a second drain electrode), the gate electrode (including a first gate electrode and a second gate electrode) may be formed of a metal material, for example, any one or more of silver (Ag), copper (Cu), aluminum (Al), titanium (Ti), molybdenum (Mo), niobium (Nb), or alloy materials of the above metals, such as aluminum-neodymium alloy (AlNd) or molybdenum-niobium alloy (MoNb), and may be in a single-layer structure, such as single-layer metal of Mo and Cu, or a multilayer composite structure, such as a double-layer structure of MTD/Cu, or a three-layer structure of MoNb/Cu/MTD, MTD/Cu/MTD, Ti/Al/Ti, or the like. Thicknesses of the first electrode, the second electrode, and the gate electrode may be 1000 Å to 10000 Å.

In an exemplary embodiment of the present disclosure, a metal thin film may be formed by a physical vapor deposition (PVD) method, a spin coating method, or the like, and then patterned and processed to form the first electrode, the second electrode, and the gate electrode. Of course, the first electrode, the second electrode, and the gate electrode may also be directly formed by silk screen printing or the like. The present disclosure is not limited herein.

In an exemplary embodiment of the present disclosure, the gate insulating layer may adopt any one or more of Silicon Oxide (SiOx), Silicon Nitride (SiNx), Silicon Oxynitride (SiON), and another high K (a dielectric constant), and may be a single layer, multiple layers, or a composite layer.

In an exemplary embodiment of the present disclosure, the buffer layer may be made of any one or more of Silicon Oxide (SiOx), Silicon Nitride (SiNx), and Silicon Oxynitride (SiON), and may be a single layer, multiple layers, or a composite layer.

In an exemplary embodiment of the present disclosure, the base substrate may be a rigid base substrate, or may be a flexible base substrate. In an exemplary embodiment of the present disclosure, the rigid base substrate may be made of a material such as glass or quartz, etc., the flexible base substrate may be made of a material such as Polyimide (PI), etc., the flexible base substrate may be in a single-layer structure, or may be in a laminated structure formed by an inorganic material layer and a flexible material layer, which is not limited in the present disclosure.

Figure 14:
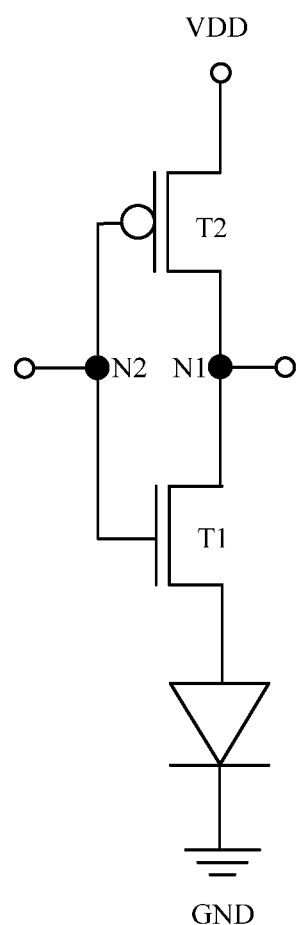
FIG. 14 is a schematic diagram of an equivalent circuit of a tunneling field effect transistor with a vertical-type dual TFET structure.

FIG. 14 is a schematic diagram of an equivalent circuit of a tunneling field effect transistor with a vertical-type dual TFET structure. As shown in FIG. 14, the tunneling field effect transistor includes a first node N1 and a second node N2, wherein the first node N1 is connected with a first gate electrode of the first tunneling field effect transistor T1 and a second gate electrode of the second tunneling field effect transistor T2, respectively, the second node N2 is connected with a first drain electrode of the first tunneling field effect transistor T1 and a second source electrode of the second tunneling field effect transistor T2, respectively, one end of the first tunneling field effect transistor T1 is connected with a common end (GND), and one end of the second tunneling field effect transistor T2 is connected with a first power supply line VDD.

An embodiment of the present disclosure also provides a display panel, including the tunneling field effect transistor as provided in the above embodiment of the present disclosure.

In an exemplary embodiment of the present disclosure, the display panel may be a Liquid Crystal Display (LCD) display panel or an Organic Light Emitting Diode (OLED) display panel.

An embodiment of the present disclosure also provides a display apparatus, including the display panel as provided in the above embodiment of the present disclosure. The display apparatus may also include an Integrated Circuit (IC) for driving the display panel, and a power supply circuit.

The display apparatus may be any product or part with a display function, such as a mobile phone, a tablet computer, a television, a display, a laptop computer, a digital photo frame, a navigator, a vehicle-mounted display, a smart watch, or a smart bracelet, etc.

Although the embodiments disclosed in the present disclosure are as above, the described contents are only embodiments used for convenience of understanding the present disclosure and are not intended to limit the present disclosure. Any person skilled in the art of the present disclosure may make any modification and change in forms and details of implementations without departing from the spirit and the scope disclosed in the present disclosure. However, the scope of protection of the present application is still subject to the scope defined in the appended claims.

The invention claimed is:

1. A tunneling field effect transistor, comprising a gate electrode, a tunneling field active layer, a first electrode, and a second electrode disposed on a base substrate; wherein
   the tunneling field active layer comprises a first-type active layer and a second-type active layer that are stacked,
   the first-type active layer comprises a first-type channel region and a first source-drain region,
   the second-type active layer comprises a second-type channel region and a second source-drain region,
   an orthographic projection of the first-type channel region on the base substrate is completely overlapped with an orthographic projection of the second-type channel region on the base substrate,
   the first source-drain region is located at a side of the tunneling field active layer and is connected with the first electrode,
   the second source-drain region is located at another side of the tunneling field active layer and is connected with the second electrode, and
   an orthographic projection of the gate electrode on the base substrate is located within a range of an orthographic projection of the first-type channel region and the second-type channel region on the base substrate;
   wherein the tunneling field effect transistor further comprises a gate insulating layer and a buffer layer; wherein
   the buffer layer is disposed at a side of the base substrate, the tunneling field active layer is disposed at a side of the buffer layer away from the base substrate, the gate insulating layer is disposed at a side of the tunneling field active layer away from the base substrate, the gate electrode is disposed at a side of the gate insulating layer away from the base substrate, the first source-drain region is a source region, the first electrode is a source electrode, the second source-drain region is a drain region, and the second electrode is a drain electrode; or
   the buffer layer is disposed at a side of the base substrate, the gate electrode is disposed at a side of the buffer layer away from the base substrate, the gate insulating layer is disposed at a side of the buffer layer away from the base substrate and covers the gate electrode, the tunneling field active layer is disposed at a side of the gate insulating layer away from the base substrate, the first source-drain region is a drain region, the first electrode is a drain electrode, the second source-drain region is a source region, and the second electrode is a source electrode.

2. The tunneling field effect transistor of claim 1, wherein the tunneling field active layer is disposed between the base substrate and the gate electrode.

3. The tunneling field effect transistor of claim 1, wherein the gate electrode is disposed between the base substrate and the tunneling field active layer.

4. The tunneling field effect transistor of claim 1, comprising a first tunneling field effect sub-transistor and a second tunneling field effect sub-transistor, wherein the first tunneling field effect sub-transistor comprises a first gate electrode, a first tunneling field active layer, a first source electrode, and a first drain electrode disposed on the base substrate, and the second tunneling field effect sub-transistor comprises a second gate electrode, a second tunneling field active layer, a second source electrode, and a second drain electrode disposed on the base substrate; wherein the first tunneling field active layer comprises a first first-type active layer and a first second-type active layer that are stacked, wherein the first first-type active layer comprises a first first-type channel region and a first source-drain region, the first second-type active layer comprises a first second-type channel region and a second source-drain region, one of the first source-drain region and the second source-drain region is a first source region and the other is a first drain region;

an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode;

the second tunneling field active layer comprises a second first-type active layer and a second second-type active layer that are stacked, wherein the second first-type active layer comprises a second first-type channel region and a third source-drain region, the second second-type active layer comprises a second second-type channel region and a fourth source-drain region, one of the third source-drain region and the fourth source-drain region is a second source region and the other is a second drain region;

an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; and an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

5. The tunneling field effect transistor of claim 1, comprising a first tunneling field effect sub-transistor and a second tunneling field effect sub-transistor, wherein the first tunneling field effect sub-transistor comprises a first gate electrode, a first tunneling field active layer, a first source electrode, and a first drain electrode disposed on the base substrate, and the second tunneling field effect sub-transistor comprises a second gate electrode, a second tunneling field active layer, a second source electrode, and a second drain electrode disposed at a side of the first tunneling field effect sub-transistor away from the base substrate; wherein the first tunneling field active layer comprises a first first-type active layer and a first second-type active layer that are stacked, wherein the first first-type active layer comprises a first first-type channel region and a first source-drain region, the first second-type active layer comprises a first second-type channel region and a second source-drain region, one of the first source-drain region and the second source-drain region is a first source region and the other is a first drain region;

an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode;

the second tunneling field active layer comprises a second first-type active layer and a second second-type active layer that are stacked, wherein the second first-type active layer comprises a second first-type channel region and a third source-drain region, the second second-type active layer comprises a second second-type channel region and a fourth source-drain region, one of the third source-drain region and the fourth source-drain region is a second source region and the other is a second drain region;

an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; and an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

6. The tunneling field effect transistor of claim 1, wherein the first-type active layer is a P-type semiconductor active layer, and the second-type active layer is an N-type metal oxide semiconductor active layer; or the first-type active layer is an N-type metal oxide semiconductor active layer, and the second-type active layer is a P-type semiconductor active layer.

7. The tunneling field effect transistor of claim 6, wherein a material of the P-type semiconductor active layer comprises any one or more of P-type semiconductor materials containing an IV-th main group element; wherein the material of the P-type semiconductor active layer comprises any one or more of P-type doped Si, P-type doped Ge, and P-type doped SiGe.

8. The tunneling field effect transistor of claim 6, wherein a material of the N-type metal oxide semiconductor active layer comprises any one or more of a metal oxide composed of at least two metals of indium, gallium, zinc, and tin.

9. The tunneling field effect transistor of claim 8, wherein the metal oxide comprises any one or more of Indium Gallium Zinc Oxide (IGZO), Indium Gallium Tin Oxide (IGTO), Indium Zinc Oxide (IZO), Indium Tin Zinc Oxide, Indium Tin Oxide, Indium Gallium Zinc Tin Oxide, and Zinc Tin Oxide; and/or the metal oxide further contains any one or more of tungsten, tantalum, and a lanthanide element.

10. The tunneling field effect transistor of claim 1, wherein, in a same tunneling field active layer, a total thickness of the first-type channel region and the second-type channel region is 110 nm to 1100 nm; and/or
in a same tunneling field active layer, lengths of the first-type channel region and the second-type channel region are both 7 nm to 15 nm.

11. A display panel, comprising the tunneling field effect transistor of claim 1.

12. A display apparatus, comprising the display panel of claim 11.

13. A manufacturing method for a tunneling field effect transistor, comprising:
forming a gate electrode, a tunneling field active layer, a first electrode, and a second electrode on a base substrate;
wherein the tunneling field active layer comprises a first-type active layer and a second-type active layer that are stacked, wherein the first-type active layer comprises a first-type channel region and a first source-drain region, the second-type active layer comprises a second-type channel region and a second source-drain region, an orthographic projection of the first-type channel region on the base substrate is completely overlapped with an orthographic projection of the second-type channel region on the base substrate, the first source-drain region is located at a side of the tunneling field active layer and is connected with the first electrode, the second source-drain region is located at another side of the tunneling field active layer and is connected with the second electrode, and an orthographic projection of the gate electrode on the base substrate is located within a range of an orthographic projection of the first-type channel region and the second-type channel region on the base substrate;
wherein the tunneling field effect transistor further comprises a gate insulating layer and a buffer layer; wherein
the buffer layer is disposed at a side of the base substrate, the tunneling field active layer is disposed at a side of the buffer layer away from the base substrate, the gate insulating layer is disposed at a side of the tunneling field active layer away from the base substrate, the gate electrode is disposed at a side of the gate insulating layer away from the base substrate, the first source-drain region is a source region, the first electrode is a source electrode, the second source-drain region is a drain region, and the second electrode is a drain electrode; or
the buffer layer is disposed at a side of the base substrate, the gate electrode is disposed at a side of the buffer layer away from the base substrate, the gate insulating layer is disposed at a side of the buffer layer away from the base substrate and covers the gate electrode, the tunneling field active layer is disposed at a side of the gate insulating layer away from the base substrate, the first source-drain region is a drain region, the first electrode is a drain electrode, the second source-drain region is a source region, and the second electrode is a source electrode.

14. The manufacturing method of claim 13, wherein the method further comprises:
forming the tunneling field active layer at a side of the base substrate, forming the gate electrode at a side of the second-type channel region away from the base substrate, and forming the first electrode and the second electrode at a side of the first source-drain region and the second source-drain region away from the base substrate, respectively; or
forming the gate electrode at a side of the base substrate, forming the tunneling field active layer covering the gate electrode at a side of the base substrate, and forming the first electrode and the second electrode at a side of the first source-drain region and the second source-drain region away from the base substrate, respectively.

15. The manufacturing method claim 13, comprising:
forming a first gate electrode, a first tunneling field active layer, a first source electrode, and a first drain electrode on the base substrate to obtain a first tunneling field effect sub-transistor; and
forming a second gate electrode, a second tunneling field active layer, a second source electrode, and a second drain electrode on the base substrate to obtain a second tunneling field effect sub-transistor; wherein
the first tunneling field active layer comprises a first first-type active layer and a first second-type active layer that are stacked, wherein the first first-type active layer comprises a first first-type channel region and a first source-drain region, the first second-type active layer comprises a first second-type channel region and a second source-drain region, one of the first source-drain region and the second source-drain region is a first source region and the other is a first drain region;
an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode;
the second tunneling field active layer comprises a second first-type active layer and a second second-type active layer that are stacked, wherein the second first-type active layer comprises a second first-type channel region and a third source-drain region, the second second-type active layer comprises a second second-type channel region and a fourth source-drain region, one of the third source-drain region and the fourth source-drain region is a second source region and the other is a second drain region;
an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; and
an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

16. The manufacturing method of claim 13, comprising:
forming a first gate electrode, a first tunneling field active layer, a first source electrode, and a first drain electrode on the base substrate to obtain a first tunneling field effect sub-transistor; and
forming a second gate electrode, a second tunneling field active layer, a second source electrode, and a second drain electrode at a side of the first tunneling field effect sub-transistor away from the base substrate to obtain a second tunneling field effect sub-transistor; wherein
the first tunneling field active layer comprises a first first-type active layer and a first second-type active layer that are stacked, wherein the first first-type active layer comprises a first first-type channel region and a first source-drain region, the first second-type active layer comprises a first second-type channel region and a second source-drain region, one of the first source-drain region and the second source-drain region is a first source region and the other is a first drain region;
an orthographic projection of the first first-type channel region on the base substrate is completely overlapped with an orthographic projection of the first second-type channel region on the base substrate, the first source region is located at a side of the first tunneling field active layer and is connected with the first source electrode, and the first drain region is located at another side of the first tunneling field active layer and is connected with the first drain electrode;
the second tunneling field active layer comprises a second first-type active layer and a second second-type active layer that are stacked, wherein the second first-type active layer comprises a second first-type channel region and a third source-drain region, the second second-type active layer comprises a second second-type channel region and a fourth source-drain region, one of the third source-drain region and the fourth source-drain region is a second source region and the other is a second drain region;

an orthographic projection of the second first-type channel region on the base substrate is completely overlapped with an orthographic projection of the second second-type channel region on the base substrate, the second source region is located at a side of the second tunneling field active layer and is connected with the second source electrode, and the second drain region is located at another side of the second tunneling field active layer and is connected with the second drain electrode; and
an orthographic projection of the first gate electrode on the base substrate is located within a range of an orthographic projection of the first first-type channel region and the first second-type channel region on the base substrate, and an orthographic projection of the second gate electrode on the base substrate is located within a range of an orthographic projection of the second first-type channel region and the second second-type channel region on the base substrate.

17. The manufacturing method of claim 13, wherein the first-type active layer is a P-type semiconductor active layer, and the second-type active layer is an N-type metal oxide semiconductor active layer; or, the first-type active layer is an N-type metal oxide semiconductor active layer, and the second-type active layer is a P-type semiconductor active layer.

18. The manufacturing method of claim 17, wherein a material of the P-type semiconductor active layer comprises any one or more of P-type semiconductor materials containing an IV-th main group element; and/or
a material of the N-type metal oxide semiconductor active layer comprises any one or more of a metal oxide composed of at least two metals of indium, gallium, zinc, and tin.

19. The manufacturing method of claim 13, wherein, in a same tunneling field active layer, a total thickness of the first-type channel region and the second-type channel region is 110 nm to 1100 nm, and lengths of the first-type channel region and the second-type channel region are both 7 nm to 15 nm.

* * * * *